(12) United States Patent
Song et al.

(10) Patent No.: US 12,125,534 B2
(45) Date of Patent: Oct. 22, 2024

(54) STORAGE DEVICE USING WAFER-TO-WAFER BONDING AND METHOD OF MANUFACTURING THE SAME

(71) Applicant: SAMSUNG ELECTRONICS CO., LTD., Suwon-si (KR)

(72) Inventors: Younggul Song, Hwaseong-si (KR); Junyeong Seok, Seoul (KR); Eun Chu Oh, Hwaseong-si (KR); Byungchul Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 214 days.

(21) Appl. No.: 17/935,122

(22) Filed: Sep. 25, 2022

(65) Prior Publication Data

US 2023/0154537 A1    May 18, 2023

(30) Foreign Application Priority Data

Nov. 17, 2021    (KR) .......................... 10-2021-0158924

(51) Int. Cl.
| | |
|---|---|
| G11C 8/00 | (2006.01) |
| G11C 5/06 | (2006.01) |
| G11C 16/04 | (2006.01) |
| G11C 16/08 | (2006.01) |
| H10B 69/00 | (2023.01) |

(52) U.S. Cl.
CPC .......... *G11C 16/0483* (2013.01); *G11C 5/063* (2013.01); *G11C 16/08* (2013.01); *H10B 69/00* (2023.02)

(58) Field of Classification Search
CPC ..................................................... G11C 16/08

USPC ...................................................... 365/230.06
See application file for complete search history.

(56) References Cited

U.S. PATENT DOCUMENTS

| | | | |
|---|---|---|---|
| 10,283,493 | B1 | 5/2019 | Nishida |
| 10,665,581 | B1 | 5/2020 | Zhou et al. |
| 10,957,680 | B2 | 3/2021 | Yada et al. |
| 11,024,600 | B2 | 6/2021 | Lu et al. |
| 11,058,454 | B2 | 7/2021 | Uu |
| 2018/0040553 | A1 | 2/2018 | Tak et al. |
| 2020/0066703 | A1 | 2/2020 | Kim et al. |
| 2020/0105721 | A1 | 4/2020 | Park |

(Continued)

OTHER PUBLICATIONS

US 11,011,639 B2, 05/2021, Xiao (withdrawn)

*Primary Examiner* — Hoai V Ho
(74) *Attorney, Agent, or Firm* — F. Chau & Associates, LLC

(57) ABSTRACT

A storage device includes a non-volatile memory device. The non-volatile memory device includes a first substrate including a first peripheral circuit region including a row decoder selecting one word line from among a plurality of word lines of a three-dimensional (3D) memory cell array and a second substrate including a second peripheral circuit region, including a page buffer unit selecting at least one bit line from among a plurality of bit lines of the 3D memory cell array, and a cell region including the 3D memory cell array formed in the second peripheral circuit region. The 3D memory cell array is disposed between the first peripheral circuit region and the second peripheral circuit region by vertically stacking and bonding the second substrate on and to the first substrate.

20 Claims, 13 Drawing Sheets

(56) References Cited

U.S. PATENT DOCUMENTS

| | | |
|---|---|---|
| 2020/0381058 A1 | 12/2020 | Lee et al. |
| 2021/0065801 A1 | 3/2021 | Kwon et al. |
| 2021/0327837 A1 | 10/2021 | Yoon |
| 2022/0005820 A1* | 1/2022 | Kim ................... H10B 43/27 |
| 2022/0139855 A1* | 5/2022 | Hwang ................ H01L 24/80 257/314 |

* cited by examiner

STORAGE DEVICE USING WAFER-TO-WAFER BONDING AND METHOD OF MANUFACTURING THE SAME

CROSS-REFERENCE TO RELATED APPLICATION

This application is based on and claims priority under 35 U.S.C. § 119 to Korean Patent Application No. 10-2021-0158924, filed on Nov. 17, 2021, in the Korean Intellectual Property Office, the disclosure of which is incorporated by reference herein in its entirety.

TECHNICAL FIELD

The inventive concept relates to a semiconductor device, and more particularly, to a storage device using wafer-to-wafer bonding and a method of manufacturing the storage device.

DISCUSSION OF THE RELATED ART

Electronic systems incorporate various forms of semiconductor chips. Such devices often make use of dynamic random access memory (DRAM) as a working memory or a main memory and make use of a storage device as a storage medium. A commonly used example of such a storage medium is a non-volatile memory device.

As a capacity of storage devices increases, the number of memory cells and word lines stacked on a substrate of a non-volatile memory is increasing, and the number of bits of data stored in a memory cell is increasing. In order to increase the degree of integration and a storage capacity of a memory, non-volatile memory devices (for example, three-dimensional (3D) NAND flash memory) where memory cells are stacked in a 3D structure are being researched. Research into storage devices for stably and quickly processing massive quantities of data in real time by using 3D NAND flash memory is being performed.

SUMMARY

A storage device includes a non-volatile memory device. The non-volatile memory device includes a first substrate, including a first peripheral circuit region including a row decoder selecting one word line from among a plurality of word lines of a three-dimensional (3D) memory cell array, and a second substrate, including a second peripheral circuit region including a page buffer unit selecting at least one bit line from among a plurality of bit lines of the 3D memory cell array. The second substrate further includes a cell region including the 3D memory cell array formed in the second peripheral circuit region. The 3D memory cell array is disposed between the first peripheral circuit region and the second peripheral circuit region by vertically stacking and bonding the second substrate on and to the first substrate.

A non-volatile memory device includes a three-dimensional (3D) memory cell array including a plurality of memory blocks. The non-volatile memory device includes a first substrate including a first peripheral circuit region including a row decoder, selecting one word line from among a plurality of word lines of the 3D memory cell array, and circuit devices operating based on a high voltage and a second substrate including a second peripheral circuit region, including a page buffer unit selecting at least one bit line from among a plurality of bit lines of the 3D memory cell array, and a cell region including the 3D memory cell array formed in the second peripheral circuit region. The cell region is disposed between the first peripheral circuit region and the second peripheral circuit region by vertically stacking and bonding the second substrate on and to the first substrate. The page buffer unit extends in a second direction vertical to a first direction.

A method of manufacturing a storage device including a three-dimensional (3D) memory cell array includes forming a first peripheral circuit region, including a row decoder selecting one word line from among a plurality of word lines of the 3D memory cell array and circuit devices operating based on a high voltage, in a first substrate. A second peripheral circuit region, including a page buffer unit selecting at least one bit line from among a plurality of bit lines of the 3D memory cell array and circuit devices operating based on a low voltage, is formed in a second substrate which differs from the first substrate. A cell region, including the 3D memory cell array, is formed on the second peripheral circuit region in the second substrate. The second substrate is vertically stacked on the first substrate and the second substrate is bonded to the first substrate so that the cell region is provided between the first peripheral circuit region and the second peripheral circuit region.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Figure 1:
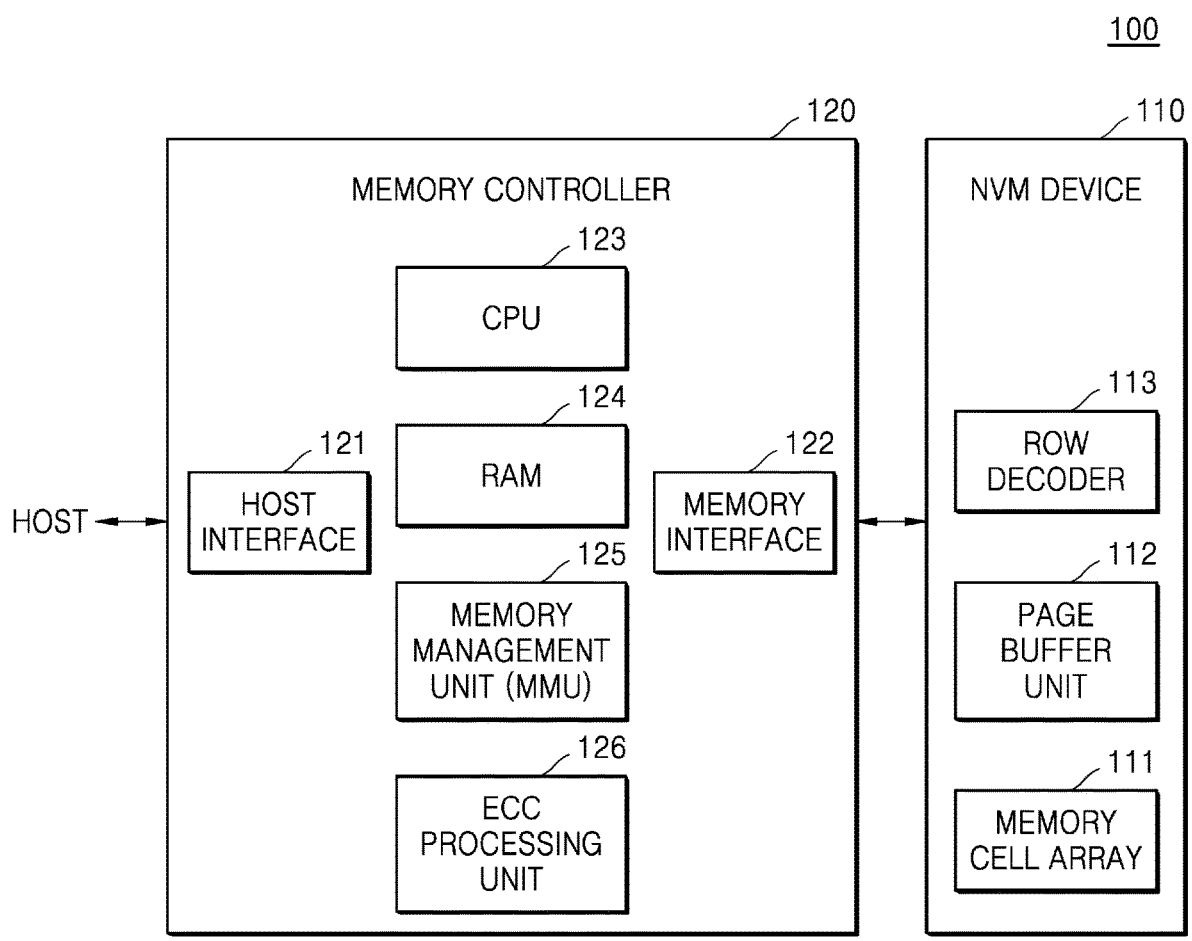
FIG. 1 is a block diagram illustrating a storage device according to an embodiment.

Hereinafter, various embodiments of the present disclosure will be described in detail with reference to the accompanying drawings. Hereinafter, in the drawings, a direction illustrated by an arrow and a direction opposite thereto will be described as the same direction. In providing descriptions with reference to the drawings, like reference numerals may refer to like or corresponding elements.

FIG. 1 is a block diagram illustrating a storage device 100 according to an embodiment.

Referring to FIG. 1, the storage device 100 may include a non-volatile memory device 110 and a memory controller 120. In FIG. 1, conceptual hardware elements included in the storage device 100 are illustrated, but the inventive concept is not necessarily limited thereto and the storage device 100 may further include other elements.

The storage device 100 may include an internal memory embedded into an electronic device. For example, the storage device 100 may include a universal flash storage (UFS) memory device, an embedded multi-media card (eMMC), or a solid state drive (SSD). The storage device 100 may include an external memory, which is detachably connected to an electric device. For example, the storage device 100 may include a UFS memory card, a compact flash (CF) card, a secure digital (SD) card, a micro secure digital (Micro-SD) card, a mini secure digital (Mini-SD) card, an extreme digital (xD) card, and/or a memory stick.

The storage device 100 may include the non-volatile memory device 110 and the memory controller 120.

The non-volatile memory device 110 may perform a write operation or a read operation under the control of the memory controller 120. The non-volatile memory device 110 may receive a command and an address from the memory controller 120 through input/output (I/O) lines and may receive or transfer, from or to the memory controller 120, data for the write operation or the read operation. In addition, the non-volatile memory device 110 may receive control signals through control lines. The non-volatile memory device 110 may include a memory cell array 111, a page buffer unit 112, and a row decoder 113.

The memory cell array 111 may include a plurality of memory cells. For example, the plurality of memory cells may include flash memory cells. However, the inventive concept is not necessarily limited thereto, and the plurality of memory cells may include resistive random access memory (RAM) (RRAM) cells, ferroelectric RAM (FRAM) cells, phase RAM (PRAM) cells, thyristor RAM (TRAM) cells, and magnetic RAM (MRAM) cells. Hereinafter, an example where a plurality of memory cells include NAND flash memory cells will be mainly described, and thus, the non-volatile memory device 110 may be referred to as an NVM device.

The memory cell array 111 may include a plurality of memory blocks (BLK1 to BLKz of FIG. 2) (where z is an integer of 2 or more), and each of the plurality of memory blocks (BLK1 to BLKz of FIG. 2) may include a plurality of pages. The memory cell array 111 may include a three-dimensional (3D) memory cell array including a plurality of cell strings and will be described below with reference to FIGS. 3 and 11.

The page buffer unit 112 may include a plurality of page buffers (PB1 to PBn of FIG. 2) (where n is an integer of 2 or more), and the plurality of page buffers (PB1 to PBn of FIG. 2) may be respectively connected to memory cells of the memory cell array 111. The page buffer unit 112 may select at least some memory cells in a column direction from among the memory cells of the memory cell array 111. The page buffer unit 112 may operate as a write driver or a sense amplifier within an operation mode. For example, the page buffer unit 112 may apply a bit line voltage, corresponding to data to be programmed, to memory cells selected from among the memory cells of the memory cell array 111 during a program operation. During a read operation, the page buffer unit 112 may sense a current or a voltage of a memory cell selected from among the memory cells of the memory cell array 111 to sense data stored in the selected memory cell.

The row decoder 113 may be connected to each of the memory cells of the memory cell array 111. The row decoder 113 may select at least some memory cells in a row direction from among the memory cells of the memory cell array 111. For example, during a program operation, the row decoder 113 may apply a program voltage and a program verify voltage to memory cells selected from among the memory cells of the memory cell array 111, and during a read operation, the row decoder 113 may apply a read voltage to memory cells selected from among the memory cells of the memory cell array 111.

In the non-volatile memory device 110, according to an embodiment, a first substrate with the row decoder 113 provided thereon may be bonded to a second substrate with the memory cell array 111 and the page buffer unit 112 provided thereon by using wafer-to-wafer bonding, and thus, the first substrate may be electrically connected to the second substrate. Therefore, an arrangement space for peripheral circuits including the page buffer unit 112 and the row decoder 113 may be additionally secured, and a wiring structure may be simplified. The non-volatile memory device 110 electrically connected to the other elements by using wafer-to-wafer bonding will be described below in detail with reference to FIGS. 3 to 9.

The memory controller 120 may control the non-volatile memory device 110 to write data in the non-volatile memory device 110 in response to a write request from the host or may control the non-volatile memory device 110 to read data stored in the non-volatile memory device 110 in response to a read request from the host. The memory controller 120 may include a host interface 121, a memory interface 122, a central processing unit (CPU) 123, RAM 124, a memory management unit (MMU) 125, and an error correction code (ECC) processing unit 126.

The host interface 121 may interface with a host to receive an operation request of the non-volatile memory device 110 from the host. For example, the host interface 121 may receive, from the host, various requests for reading and writing data and may generate various internal signals for an operation of the non-volatile memory device 110 in response to the received request. For example, the host interface 121 may be configured to communicate with the host through at least one of various interface protocols such as advanced technology attachment (ATA), serial ATA (SATA), external SATA (e-SATA), small computer small interface (SCSI), serial attached SCSI (SAS), peripheral component interconnection (PCI), PCI express (PCI-E), IEEE 1394, a universal serial bus (USB) interface, an SD card interface, a multimedia card (MMC) interface, an eMMC interface, a compact flash (CF) card interface.

The memory interface 122 may provide an interface between the memory controller 120 and the non-volatile memory device 110. For example, write data and read data may be transferred or received between the memory controller 120 and the non-volatile memory device 110 through the memory interface 122. Also, the memory interface 122 may provide a command and an address to the non-volatile memory device 110 and may receive various pieces of information from the non-volatile memory device 110 to provide the received information to the memory controller 120.

The CPU 123 may control an overall operation of the memory controller 120. The CPU 123 may execute firmware that has been loaded into the RAM 124 to control an overall operation of the memory controller 120. The CPU 123 may correct weights or biases of an artificial neural network model stored in the MMU 125 according to training data. The weights or biases of the artificial neural network model may be corrected based on various degradation conditions (for example, a retention time, a read count, and various combinations of the retention time and the read count).

The RAM 124 may include a working memory of the memory controller 120. The RAM 124 may be implemented as various memories, and for example, may be implemented as a cache memory, DRAM, static RAM (SRAM), PRAM, and/or a flash memory device.

The MMU 125 may store code for controlling or managing the performance of reliability of the non-volatile memory device 110, and the code may be executed or upgraded by the CPU 123. Firmware such as a flash translation layer (FTL) stored in the MMU 125 may be operated by the CPU 123. The FTL may be used for managing mapping information representing a relationship between a logical address of the host and a physical address of the non-volatile memory device 110. However, a function of the FTL is not necessarily limited thereto, and for example, the FTL may be used to manage data retention caused by the wear-leveling, bad block, and unexpected power cut-off of the non-volatile memory device 110.

The MMU 125 may store degradation information about the non-volatile memory device 110 degraded by various causes according to a use pattern and a use environment of a user. The degradation information may include a program/erase cycle, an erase count, a program count, a read count, a wear level count, an elapse time, and an operation temperature. The MMU 125 may change operation conditions of the non-volatile memory device 110 according to the degradation information about the non-volatile memory device 110. Operation conditions changed by the MMU 125 may be previously set in the storage device 100. Also, the MMU 125 may monitor a degradation state of the non-volatile memory device 110 in real time, and thus, may change the operation conditions. The MMU 125 may include a deep learning machine specialized to execute or learn the artificial neural network model.

The ECC processing unit 126 may perform ECC encoding and decoding processing on data written in the non-volatile memory device 110 and data read from the non-volatile memory device 110, and thus, may detect and correct for data errors. The ECC processing unit 126 may generate an ECC for correcting a fail bit or an error bit of data transferred to the non-volatile memory device 110 or received from the non-volatile memory device 110. The ECC processing unit 126 may perform error correction encoding on write data provided to the non-volatile memory device 110 to generate write data to which a parity bit is added. The parity bit may be stored in the non-volatile memory device 110. Also, the ECC processing unit 126 may perform error correction decoding on read data output from the non-volatile memory device 110. The ECC processing unit 126 may obtain error-corrected ECC data by using a parity bit of read data read through a read operation. The ECC processing unit 126 may correct an error by using coded modulation such as a low density parity check (LDPC) code, a BCH code, a turbo code, a Reed-Solomon code, a convolution code, a recursive systematic code (RSC), trellis-coded modulation (TCM), or block coded modulation (BCM).

Hereinafter, the non-volatile memory device 110 will be described.

Figure 2:
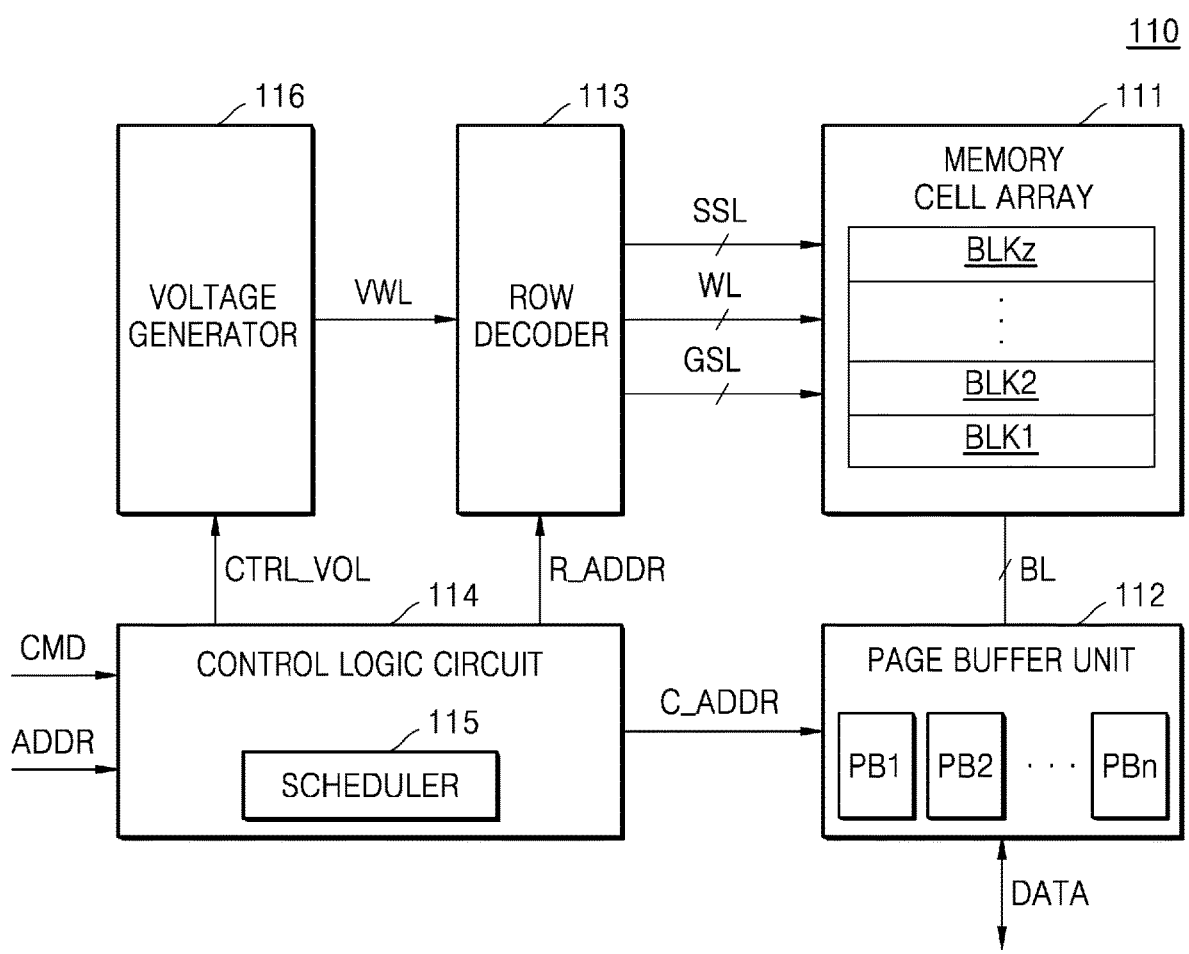
FIG. 2 is a block diagram of a non-volatile memory device according to an embodiment.

FIG. 2 is a block diagram of a non-volatile memory device 110 according to an embodiment. In detail, FIG. 2 is an exemplary block diagram of the non-volatile memory device 110 of FIG. 1. Hereinafter, FIG. 2 will be described with reference to FIG. 1.

Referring to FIG. 2, the non-volatile memory device 110 may include a memory cell array 111, a page buffer unit 112, a row decoder 113, a control logic circuit 114, and a voltage generator 116. The non-volatile memory device 110 may further include a command decoder, an address decoder, and an I/O circuit.

The memory cell array 111 may include a plurality of memory blocks BLK1 to BLKz, and each of the plurality of memory blocks BLK1 to BLKz may include a plurality of memory cells. The memory cell array 111 may be connected to the page buffer unit 112 through bit lines BL and may connected to the row decoder 113 through word lines WL, string selection lines SSL, and ground selection lines GSL.

The memory cell array 111 may include a 3D memory cell array, and the 3D memory cell array may include a plurality of memory NAND strings. Each of the memory NAND strings may include memory cells respectively connected to word lines, which are vertically stacked on a substrate. U.S. Pat. Nos. 7,679,133, 8,553,466, 8,654,587, and 8,559,235 and U.S. Patent Application No. 2011/0233648 may be incorporated herein in their entirety by reference.

The page buffer unit 112 may include a plurality of page buffers PB1 to PBn (where n is an integer of 2 or more), and the plurality of page buffers PB1 to PBn may be respectively connected to memory cells through a plurality of bit lines BL. The page buffer unit 112 may select at least one bit line from among the bit lines BL in response to a column address C_ADDR. The page buffer unit 112 may operate as a write driver or a sense amplifier according to an operation mode. For example, the page buffer unit 112 may apply a bit line voltage, corresponding to data to be programmed, to a selected bit line during a program operation. During a read operation, the page buffer unit 112 may sense a current or a voltage of the selected bit line to sense data stored in a memory cell.

The page buffer unit 112 may be provided on the same substrate as the memory cell array 111. The page buffer unit 112 and the memory cell array 111 may be implemented in a cell on peripheral (CoP) structure. For example, a peripheral circuit region including the page buffer unit 112 may be formed in the substrate, and a cell region including the memory cell array 111 may be disposed in a peripheral circuit region including the page buffer unit 112.

The row decoder 113 may select one word line WL from among a plurality of word lines WL in response to a row address R_ADDR, select one string selection line SSL from among a plurality of string selection lines SSL, and select one ground selection line GSL from among a plurality of ground selection lines GSL. For example, during a program operation, the row decoder 113 may apply a program voltage and a program verify voltage to the selected word line WL, and during a read operation, the row decoder 113 may apply a read voltage to the selected word line WL. The row decoder 113 may be provided on a substrate, which differs from the substrate with the page buffer unit 112 provided thereon.

The control logic circuit 114 may overall control various operation modes of the non-volatile memory device 110.

The control logic circuit 114 may receive a command CMD and/or an address ADDR from a memory controller (120 of FIG. 1). The control logic circuit 114 may output various internal control signals for allowing the memory cell array 111 to perform a program operation, a read operation, or an erase operation according to the command CMD and/or the address ADDR. For example, the control logic circuit 114 may store data in the memory cell array 111 by using the various internal control signals or may read data stored in the memory cell array 111 and may output the read data to the memory controller (120 of FIG. 1). The control logic circuit 114 may provide the row address R_ADDR to the row decoder 113, provide the column address C_ADDR to the page buffer unit 112, and provide a voltage control signal CTRL_VOL to the voltage generator 116.

The control logic circuit 114 may include a scheduler 115, which adjusts voltage levels of control signals according to an operation mode of the non-volatile memory device 110 and controls a voltage application timing and/or a voltage application time. The scheduler 115 may be implemented with a micro controller unit (MCU), which controls an operation characteristic of the non-volatile memory device 110. The scheduler 115 may control program, read, and/or erase operation conditions of the memory cell array 111. The scheduler 115 may control a voltage level, a voltage application timing, and a voltage application time each associated with a program voltage, a program verify voltage, and/or a read voltage each corresponding to a selected word line, an erase voltage corresponding to a selected block, and a bit line voltage corresponding to a selected bit line, according to an operation mode of the non-volatile memory device 110. The scheduler 115 may control operation conditions of the non-volatile memory device 110 in connection with an MMU (125 of FIG. 1) of the memory controller 120.

The voltage generator 116 may generate various kinds of voltages for performing program, read, and erase operations according to the voltage control signal CTRL_VOL. For example, the voltage generator 116 may generate a program voltage, a program verify voltage, a read voltage, or an erase voltage as a word line voltage VWL.

According to an embodiment, the row decoder 113 and the page buffer unit 112 may be provided on different substrates, and thus, a connection structure between peripheral circuits may be simplified and a space where the peripheral circuits are arranged may be secured. Therefore, the row decoder 113 may be additionally arranged in an additionally secured space or circuit configurations of the memory controller (120 of FIG. 1) may be internally provided, and thus, the storage device 100 may be better able to operate at higher speeds. In addition, a process of manufacturing the non-volatile memory device 110 may be simplified, and thus, the manufacturing cost may be reduced. Hereinafter, a structure of the non-volatile memory device 110 will be described in detail with reference to FIG. 3.

Figure 3:
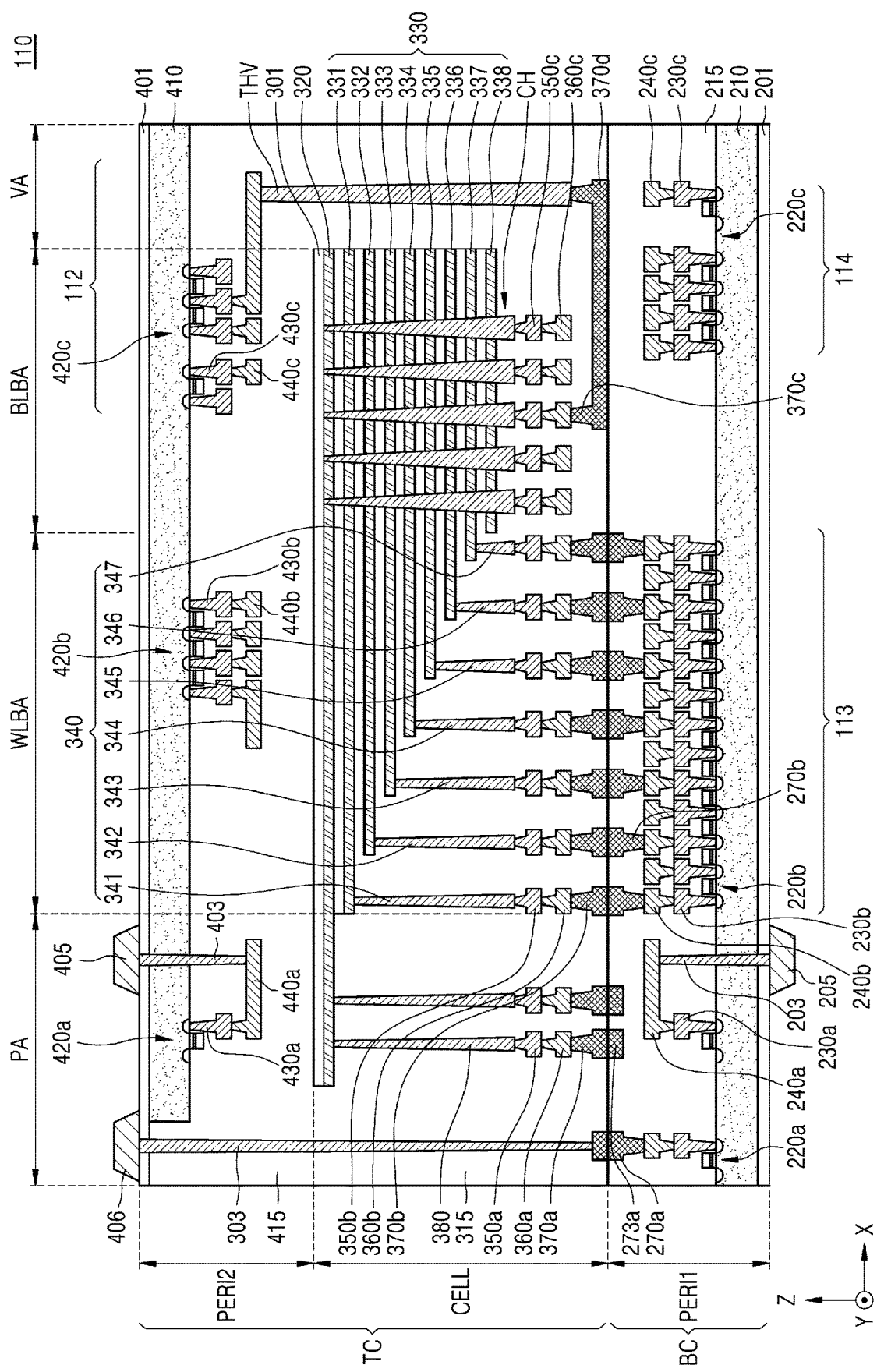
FIG. 3 is a cross-sectional view describing a structure of a non-volatile memory device according to an embodiment.

FIG. 3 is a cross-sectional view describing a structure of a non-volatile memory device 110 according to an embodiment. In detail, FIG. 3 is a diagram describing a structure of the non-volatile memory device 110 of FIG. 2. Hereinafter, FIG. 3 will be described with reference to FIG. 2.

Referring to FIG. 3, the non-volatile memory device 110 may be implemented by electrically connecting a plurality of substrates by using wafer-to-wafer bonding. The non-volatile memory device 110 may have a chip to chip (C2C) structure. The C2C structure may denote a structure where a bottom chip BC is connected to a top chip TC by a wafer-to-wafer bonding scheme after the bottom chip BC including a first peripheral circuit region PERI1 is manufactured on a first substrate 210 and the top chip TC including a cell region CELL and a second peripheral circuit region PERI2 is manufactured on a second substrate 410, which differs from the first substrate 210. The wafer-to-wafer bonding scheme may denote a scheme which electrically connects a bonding metal, formed on an uppermost metal layer of the bottom chip BC, to a bonding metal formed on an uppermost metal layer of the top chip TC. In a case where a bonding metal includes copper (Cu), a bonding scheme may be a Cu—Cu bonding scheme, but the bonding metal is not necessarily limited thereto and may include aluminum (Al) or tungsten (W).

Each of the first peripheral circuit region PERI1, the second peripheral circuit region PERI2, and the cell region CELL of the non-volatile memory device 110 may include an external pad bonding region PA, a word line bonding region WLBA, a bit line bonding region BLBA, and a through via region VA. A metal pattern of an uppermost metal layer may be provided as a dummy pattern in each of the external pad bonding region PA and the bit line bonding region BLBA included in each of the cell region CELL, the first peripheral circuit region PERI1, and the second peripheral circuit region PERI2, or the uppermost metal layer may be empty.

The first peripheral circuit region PERI1 may include a first substrate 210, an interlayer insulation layer 215 formed on the first substrate 210, a plurality of circuit devices 220a to 220c provided on the first substrate 210, first metal layers 230a and 230b connected to each of the plurality of circuit devices 220a to 220c, and second metal layers 240a and 240b formed on the first metal layers 230a and 230b.

The interlayer insulation layer 215 may be formed on the first substrate 210. The interlayer insulation layer 215 may cover the plurality of circuit devices 220a to 220c, the first metal layers 230a and 230b, and the second metal layers 240a and 240b, on the first substrate 210. The interlayer insulation layer 215 may include an insulating material such as silicon oxide or silicon nitride.

The plurality of circuit devices 220a to 220c may each include the row decoder 113 and transistors which operate with a high voltage. For example, the plurality of circuit devices 220a to 220c may include at least some of the row decoder 113, the control logic circuit 114, and the voltage generator 116. Because a leakage current is minimized even when the transistors operating with a high voltage are driven by the high voltage, the transistors may be formed on the first substrate 210, and thus, a degradation caused by a high temperature may be prevented.

The first metal layers 230a and 230b may be formed in a source/drain region of each of the plurality of circuit devices 220a to 220c provided on the first substrate 210, and the second metal layers 240a and 240b may be formed on the first metal layers 230a and 230b. The first metal layers 230a and 230b may include tungsten where electrical resistivity is relatively high, and the second metal layers 240a and 240b may include copper where electrical resistivity is relatively low. In FIG. 3, only the first metal layers 230a and 230b and the second metal layers 240a and 240b are illustrated, but the present disclosure is not necessarily limited thereto and one or more metal layers may be further formed on the second metal layers 240a and 240b. At least some of the one or more metal layers formed on the second metal layers 240a and 240b may include aluminum having electrical resistivity, which is lower than that of copper included in the second metal layers 240a and 240b.

Bonding metals 270a and 270b may be respectively formed on the second metal layers 240a and 240b. The bonding metals 270a and 270b of the first peripheral circuit region PERI1 may be electrically connected to the bonding metals 370a and 370b of the cell region CELL by the wafer-to-wafer bonding scheme. The bonding metals 270a and 270b may be formed in the same shape as that of each of the bonding metals 370a and 370b of the cell region CELL. The bonding metal 270a of the external pad bonding region PA might not be connected to a separate contact formed in the first peripheral circuit region PERI1. Similarly, the bonding metals 370a and 370b of the cell region CELL may be formed in the same shape as that of each of the bonding metals 270a and 270b of the first peripheral circuit region PERI1. The bonding metals 270a and 270b of the first peripheral circuit region PERI1 and the bonding metals 370a and 370b of the cell region CELL may include Al, Cu, or W.

The circuit devices 220c provided in the bit line bonding region BLBA and the through via region VA may configure at least some of the control logic circuit 114 and the voltage generator 116.

The circuit devices 220c provided in the bit line bonding region BLBA and the through via region VA may configure the control logic circuit 114. The circuit devices 220b configuring the row decoder 113 may be connected to the bonding metals 370a and 370b of the cell region CELL through the bonding metals 270a and 270b.

A first I/O pad 205 may be disposed in the external pad bonding region PA. A lower insulation layer 201 covering a bottom surface of the first substrate 210 may be formed under the first substrate 210, and the first I/O pad 205 may be formed on the lower insulation layer 201. For example, the first I/O pad 205 may be detached from the first substrate 210 by the lower insulation layer 201. The first I/O pad 205 may be connected to at least one of the plurality of circuit devices 220a to 220c, disposed in the first peripheral circuit region PERI1, through a first I/O contact plug 203 passing through the first substrate 210 and the lower insulation layer 201. A side insulation layer may be further provided between the first I/O contact plug 203 and the first substrate 210, and the first I/O contact plug 203 may be electrically disconnected from the first substrate 210 by the side insulation layer. The first I/O pad 205 may be optionally formed.

The cell region CELL may be formed on the second peripheral circuit region PERI2. The cell region CELL and the second peripheral circuit region PERI2 may be formed on the same substrate and may be implemented in a chip on peri (CoP) structure.

As the bottom chip BC is connected to the top chip TC by the wafer-to-wafer bonding scheme, the cell region CELL may be formed between the first peripheral circuit region PERI1 and the second peripheral circuit region PERI2. The through via region VA, the bit line bonding region BLBA, the word line bonding region WLBA, and the external pad bonding region PA may be defined based on elements of the cell region CELL.

The cell region CELL may provide at least one memory block. The cell region CELL may include a common source line 320. A lower insulation layer 301 covering a bottom surface of the common source line 320 may be formed under the common source line 320. A plurality of word lines 331 to 338 (330) may be stacked on the common source line 320 in a third direction Z vertical to a top surface of the common source line 320. String selection lines and a ground selection line may be further disposed on and under the plurality of word lines 330, and the plurality of word lines 330 may be disposed between the string selection lines and the ground selection line.

A through via THV may be formed in the through via region VA. The through via THV may extend in the third direction Z and may pass through the interlayer insulation layer 315. A bonding metal 370d may be formed on the through via THV, and the bonding metal 370d in the through via region VA may be electrically connected to a bonding metal 370c formed in the bit line bonding region BLBA. The through via THV may be electrically connected to a second metal layer 440c of the second peripheral circuit region PERI2. The through via THV may pass through the interlayer insulation layer 315 of the cell region CELL and may connect the bonding metal 370c of the cell region CELL to the second metal layer 440c of the second peripheral circuit region PERI2, and thus, may electrically connect the circuit devices 420c of the second peripheral circuit region PERI2 to a channel structure CH of the cell region CELL formed in the bit line bonding region BLBA. A region where the through via THV is disposed may be defined as a through via region VA.

The channel structure CH may be formed in the bit line bonding region BLBA. The channel structure CH may extend in the third direction Z and may pass through the plurality of word lines 330, the string selection lines, and the ground selection line. The channel structure CH may include a data storage layer and a buried insulation layer, and the channel layer may be electrically connected to a first metal layer 350c and a second metal layer 360c. The first metal layer 350c may a bit line contact, and the second metal layer 360c may be a bit line. Hereinafter, the second metal layer 360c may be referred to as a bit line. The bit line 360c may extend in a second direction Y parallel to a top surface of the second substrate 410. A region, where the channel structure CH and the bit line 360c are disposed, may be defined as the bit line bonding region BLBA.

The bit line 360c may be electrically connected to circuit devices 420c, provided in the second peripheral circuit region PERI2, through the bonding metal 370c and the through via THV. For example, the bit line 360c may be connected to the bonding metals 370c and 370d of the cell region CELL, the bonding metals 370c and 370d may be connected to the through via THV, and the through via THV may be connected to the circuit devices 420c of the second peripheral circuit region PERI2, and thus, the bit line 360c may be electrically connected to the circuit devices 420c provided in the second peripheral circuit region PERI2.

The word lines 330 including pads having different lengths may be formed in the word line bonding region WLBA. The word lines 330 may extend in the first direction X parallel to the top surface of the common source line 320. The word lines 330 may include pads, and at least some of the pads may extend by different lengths in the first direction X. The word lines 330 may be connected to a plurality of cell contact plugs 341 to 347 (340) through the pads.

The first metal layer 350b and the second metal layer 360b may be sequentially formed on the cell contact plugs 340. The bonding metal 370b may be formed on the second metal layer 360b and may be connected to the bonding metal 270b of the first peripheral circuit region PERI1. For example, the cell contact plugs 340 may be connected to the circuit devices 220b, providing the row decoder 113 in the first peripheral circuit region PERI1, through the bonding metal 370b of the cell region CELL and the bonding metal 270b of the first peripheral circuit region PERI1.

A common source line contact plug 380 and a third I/O contact plug 303 may be formed in the external pad bonding region PA. The common source line contact plug 380 may be electrically connected to the common source line 320.

The common source line contact plug 380 may include a conductive material such as metal, a metal compound, or polysilicon. The first metal layer 350b and the second metal layer 360b may be sequentially formed on the common source line contact plug 380. A region, where the common source line contact plug 380, the first metal layer 350a, and the second metal layer 360a are provided, may be defined as the external pad bonding region PA.

The third I/O contact plug 303 may be spaced apart from the common source line contact plug 380. The third I/O contact plug 303 may pass through the interlayer insulation layer 315 of the cell region CELL. The third I/O contact plug 303 may be connected to the bonding metal 370a. The lower insulation layer 301 and the common source line 320 might not be disposed in a region where the third I/O contact plug 303 is provided. The third I/O contact plug 303 may pass through the interlayer insulation layer 315 of the cell region CELL and an interlayer insulation layer 415 of the second peripheral circuit region PERI2.

The second peripheral circuit region PERI2 may include a second substrate 410, the interlayer insulation layer 415 formed on the second substrate 410, a plurality of circuit devices 420a to 420c provided on the second substrate 410, a plurality of first metal layers 430a to 430c respectively connected to the plurality of circuit devices 420a to 420c, and a plurality of second metal layers 440a to 440c respectively formed on the first metal layers 430a to 430c.

The interlayer insulation layer 415 of the second peripheral circuit region PERI2 may cover the plurality of circuit devices 420a to 420c, the first metal layers 430a to 430c, and the second metal layers 440a to 440c, on the second substrate 410. The interlayer insulation layer 415 may include an insulating material such as silicon oxide or silicon nitride.

The plurality of circuit devices 420a to 420c may each include a page buffer unit 112 and transistors which operate with a low voltage. For example, the plurality of circuit devices 420a to 420c may include transistors which are a data transfer path. The transistors operating with a low voltage may be degrade less due to a leakage current than transistors operating with a high voltage. Therefore, the transistors operating with a low voltage may be formed in the second substrate 410, and thus, an arrangement region for peripheral circuits may be secured.

The first metal layers 430a to 430c may be formed in source/drain regions of the plurality of circuit devices 420a to 420c provided on the second substrate 410, and the second metal layers 440a to 440c may be formed on the first metal layers 430a to 430c. The first metal layers 430a to 430c may include a material which has higher electrical resistivity than the second metal layers 440a to 440c. For example, the first metal layers 430a to 430c may include W, and the second metal layers 440a to 440c may include Cu. In FIG. 3, only the first metal layers 430a to 430c and the second metal layers 440a to 440c are illustrated, but the present disclosure is not necessarily limited thereto and one or more metal layers may be further formed on the second metal layers 440a to 440c. At least some of the one or more metal layers formed on the second metal layers 440a to 440c may include a material having electrical resistivity which is lower than that of the second metal layers 440a to 440c. For example, at least some of the one or more metal layers formed on the second metal layers 440a to 440c may include A1.

The circuit devices 420c provided in the bit line bonding region BLBA may configure the page buffer unit 112. The first metal layer 430c and the second metal layer 440c may be formed on the circuit devices 420c configuring the page buffer unit 112, and the second metal layer 440c may be connected to the through via THV of the cell region CELL. Therefore, the circuit devices 420c configuring the page buffer unit 112 may be electrically connected to a bit line 360c of the cell region CELL.

An operation voltage of each of the circuit devices 420c configuring the page buffer unit 112 may differ from that of each of the circuit devices 220b configuring the row decoder 113. For example, an operation voltage of each of the circuit devices 420c configuring the page buffer unit 112 may be greater than that of each of the circuit devices 220b configuring the row decoder 113.

A second I/O pad 405 and a third I/O pad 406 may be disposed in the external pad bonding region PA. The lower insulation layer 401 covering a bottom surface of the second substrate 410 may be formed under the second substrate 410, and the second I/O pad 405 and the third I/O pad 406 may be formed on the lower insulation layer 401.

The second I/O pad 405 may be connected to at least one of the plurality of circuit devices 420a to 420c, disposed in the second peripheral circuit region PERI2, through the second I/O contact plug 403. The second I/O pad 405 may be detached from the second substrate 410 by the lower insulation layer 401. A side insulation layer may be further disposed between the second I/O contact plug 403 and the second substrate 410, and the second I/O contact plug 403 may be electrically disconnected from the second substrate 410 by the side insulation layer.

The third I/O pad 406 may be connected to the third I/O contact plug 303. The third I/O contact plug 303 may pass through the interlayer insulation layer 315 of the cell region CELL and the interlayer insulation layer 415 of the second peripheral circuit region PERI2 and may be connected to at least one of the circuit devices 220a to 220c of the first peripheral circuit region PERI1. The second and third I/O pads 405 and 406 may be optionally formed.

According to an embodiment, the first peripheral circuit region PERI1 formed in the first substrate 210 and the cell region CELL and the second peripheral circuit region PERI2 each formed in the second substrate 410 may be manufactured in different processes, and thus, a process of manufacturing the non-volatile memory device 110 may be simplified, thereby reducing the manufacturing cost of the non-volatile memory device 110. Also, unlike that all circuit devices are provided on one substrate, according to an embodiment, the circuit devices 220b configuring the row decoder 113 may be provided on the first substrate 210, and the circuit devices 420c configuring the page buffer unit 112 may be provided on the second substrate 410. As described above, circuit devices operating based on a high voltage may be provided on the first substrate 210 and circuit devices operating based on a low voltage may be provided on the second substrate 410, and thus, a leakage current of the non-volatile memory device 110 may decrease and the non-volatile memory device 110 may be better able to operate at higher speeds.

Hereinafter, a storage device including the non-volatile memory device 110 described above with reference to FIG. 4 will be described, and in detail, the arrangement of each element of the storage device will be described.

Figure 4:
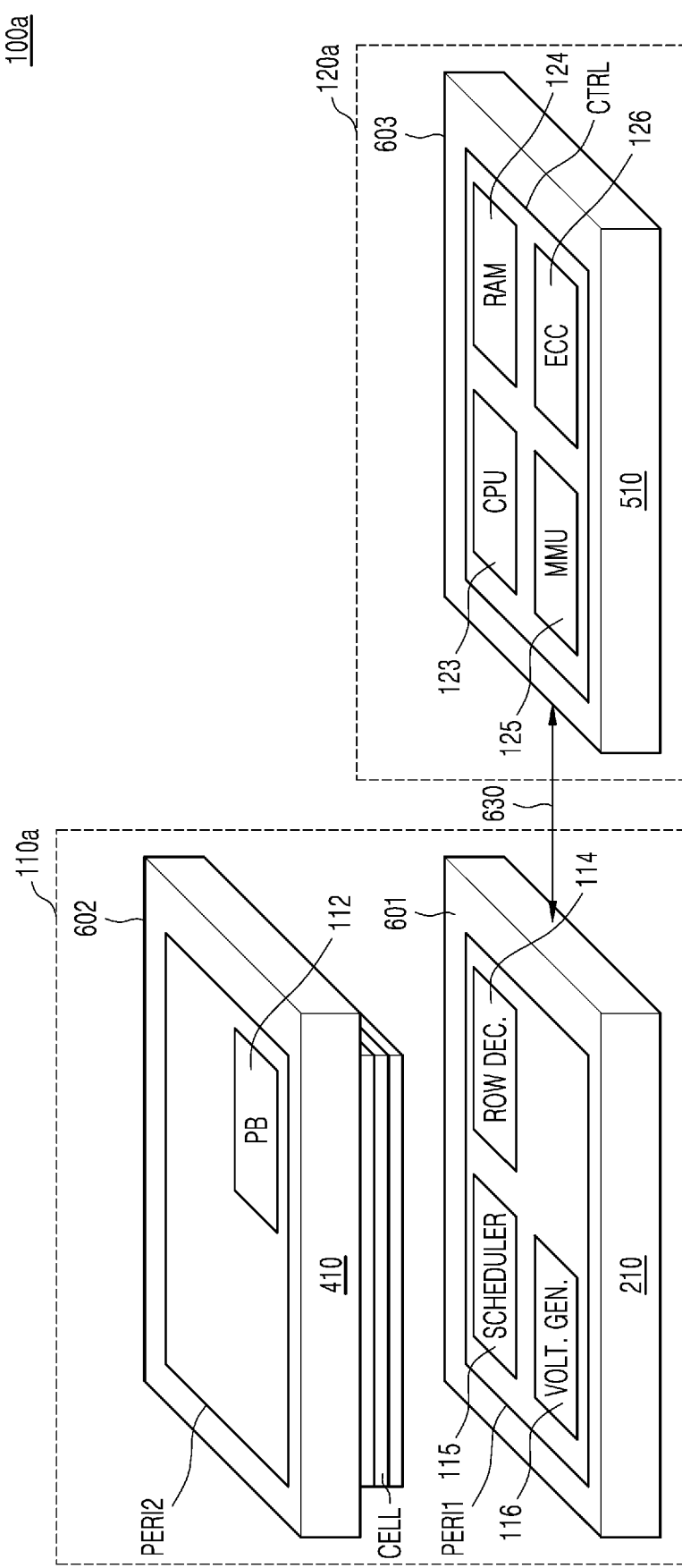
FIG. 4 is a diagram illustrating a storage device implemented through wafer-to-wafer bonding, according to an embodiment.

FIG. 4 is a diagram illustrating a storage device 100a implemented with wafer-to-wafer bonding, according to an embodiment. In detail, FIG. 4 is a diagram describing an example where the storage device 100 of FIG. 1 is implemented through wafer-to-wafer bonding. Hereinafter, FIG. 4 will be described with reference to FIGS. 1 to 3, and subscripts (for example, a of 100a, and b of 100b) added to reference numerals are for classifying a plurality of circuits having the same function. In FIG. 4 and the following drawings, a second peripheral circuit region PERI2 is illustrated on a second surface which is a rear surface of a first surface where a cell region CELL of a second substrate 410 is formed, but this is for convenience of description, as illustrated in FIG. 3, the second peripheral circuit region PERI2 may be formed in the first surface where the cell region CELL of the second substrate 410 is formed and may be formed between the second substrate 410 and the cell region CELL.

Referring to FIG. 4, the storage device 100a may include a non-volatile memory device 110a and a memory controller 120a.

The non-volatile memory device 110a may include a first chip 601 including a first peripheral circuit region PERI1 formed in the first substrate 210 and a second chip 602 including a cell region CELL and a second peripheral circuit region PERI2 formed in the second substrate 410. The non-volatile memory device 110a may face the first chip 601 as the second chip 602 is reversed. The non-volatile memory device 110a, as illustrated in FIG. 3, may be implemented through the wafer-to-wafer bonding scheme where bonding metals 370a and 370b of the cell region CELL are electrically connected to bonding metals 270a and 270b of the first peripheral circuit region PERI1.

A scheduler 115, a voltage generator 116, and a row decoder 113 may be disposed in the first peripheral circuit region PERI1 of the first chip 601, and a page buffer unit 112 may be disposed in the second peripheral circuit region PERI2 of the second chip 602. In FIG. 4, it is illustrated that only the scheduler 115 of the control logic circuit 114 is disposed in the first peripheral circuit region PERI1, but the inventive concept is not necessarily limited thereto and the other circuits of the control logic circuit 114 may be disposed in the first peripheral circuit region PERI1. Transistors operating with a high voltage may be disposed in the first peripheral circuit region PERI1.

It is illustrated that only the page buffer unit 112 is disposed in the second peripheral circuit region PERI2 of the second chip 602, but the inventive concept is not necessarily limited thereto and transistors operating with a low voltage may be additionally disposed in the second peripheral circuit region PERI2.

A memory controller 120a may be implemented as a third chip 603 including a control circuit region CTRL formed in a third substrate 510. A CPU 123, RAM 124, an MMU 125, and an ECC processing unit 126 may be provided in the control circuit region CTRL. The first chip 601, the second chip 602, and the third chip 603 may be manufactured through different processes.

The first chip 601 and the second chip 602 may be electrically connected to the memory controller 120a through conductive wires 630. After the first chip 601 is coupled to the second chip 602 through the wafer-to-wafer bonding scheme, the conductive wires 630 may be connected to I/O pads 205, 405, and 406 of an external pad bonding region PA formed in a rear surface of the first substrate 210 and a rear surface of the second substrate 410. The first chip 601 and the second chip 602 may transfer or receive a signal to or from the third chip 603 through the conductive wires 630. For example, the first chip 601 and the second chip 602 may transfer or receive a chip enable signal, a command latch enable signal, an address latch enable signal, a write enable signal, a command, a plurality of data signals including an address and data, a read enable signal, and/or a data strobe signal to or from the third chip 603 through the conductive wires 630.

According to an embodiment, as the first peripheral circuit region PERI1 and the second peripheral circuit region PERI2 are formed in different substrates, a wiring structure may be simply implemented. Therefore, a signal transfer speed may increase, and signal delay may decrease. Also, an arrangement space for peripheral circuits may be secured, and thus, peripheral circuits for increasing performance may be additionally provided.

According to an embodiment, peripheral circuits (for example, the row decoder 113) operating based on a high voltage may be provided in the first chip 601 and peripheral circuits (for example, the page buffer unit 112) operating based on a low voltage may be provided in the second chip 602, and thus, a degradation in performance of the non-volatile memory device 110a caused by a high temperature may decrease and a leakage current may be reduced. Because the row decoder 113 operating based on a low voltage is provided in the first chip 601, unlike a case where the row decoder 113 is provided in the second chip 602, it might not be required that a degradation caused by a high temperature is previously prevented, and thus, the row decoder 113 may be relatively small. Therefore, a space where a peripheral circuit is disposed in the first peripheral circuit region PERI1 of the first chip 601 may be additionally secured.

Figure 5:
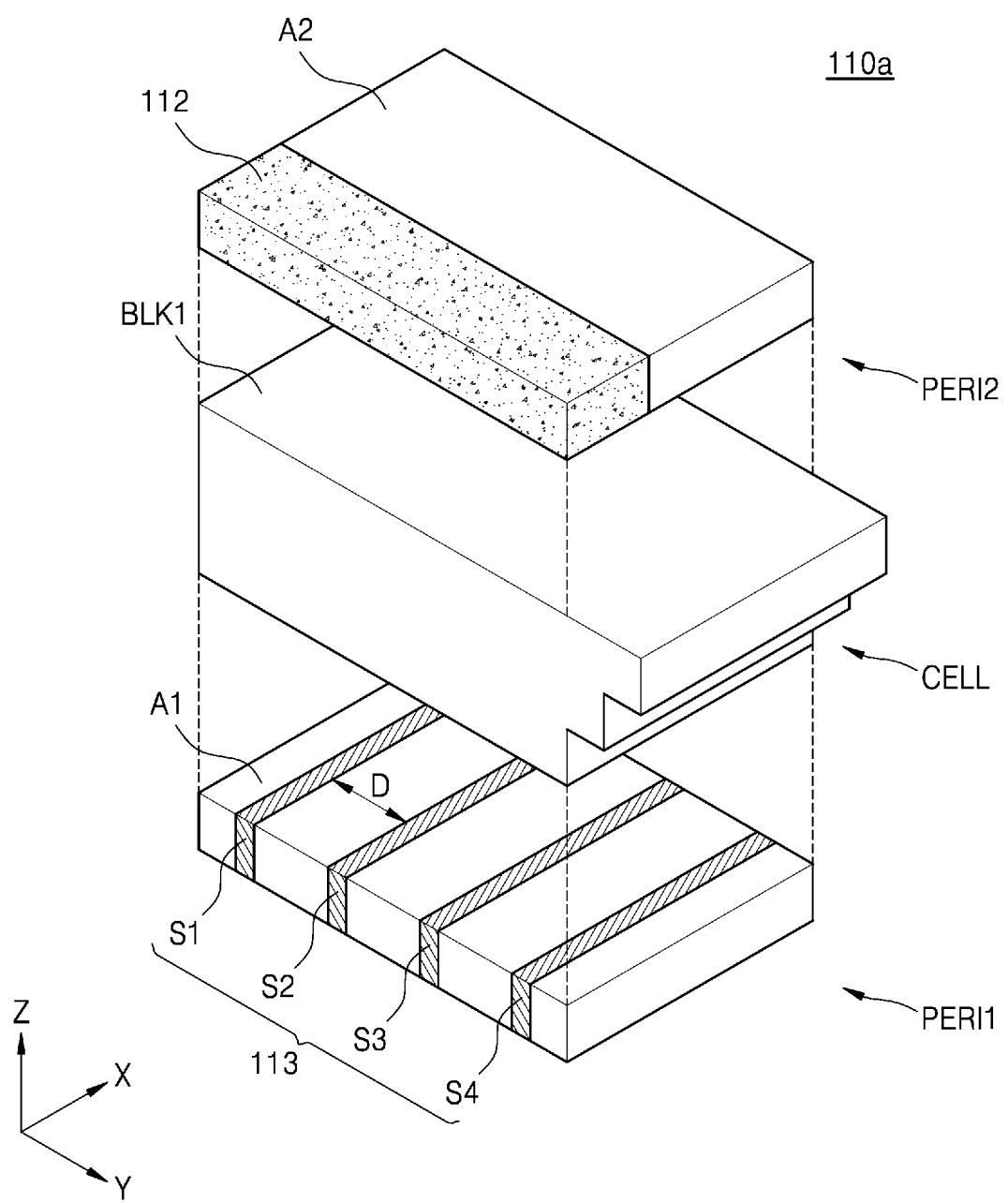
FIG. 5 is a diagram illustrating a non-volatile memory device implemented through wafer-to-wafer bonding, according to an embodiment.

FIG. 5 is a diagram illustrating a non-volatile memory device 110a implemented with wafer-to-wafer bonding, according to an embodiment. In detail, FIG. 5 is a diagram describing an embodiment where the non-volatile memory device 110a of FIG. 4 is implemented through wafer-to-wafer bonding. Hereinafter, for convenience of description, the first substrate 210 and the second substrate 410 are omitted, and FIG. 5 will be described with reference to FIGS. 1 to 4.

Referring to FIG. 5, a row decoder 113 disposed in a first peripheral circuit region PERI1 may include a plurality of sub row decoders S1 to S4. The plurality of sub row decoders S1 to S4 may extend in a first direction X and may be spaced apart from one another in a second direction Y. The plurality of sub row decoders S1 to S4 may be spaced apart from one another by at the same interval D. For example, the plurality of sub row decoders S1 to S4 may be arranged at an equal interval in fours with respect to one memory block (for example, a first memory block BLK1). For example, each of the plurality of sub row decoders S1 to S4 may be disposed to drive data of 2 KB. Peripheral circuits (for example, a voltage generator 116) operating based on a high voltage may be disposed in a region A1 between the plurality of sub row decoders S1 to S4.

A page buffer unit 112 disposed in a second peripheral circuit region PERI2 may extend in the second direction Y and may cover one surface of a second substrate (410 of FIG. 4) in the second direction Y. Peripheral circuits operating based on a low voltage may be disposed in a region A2, except the page buffer unit 112, in the second peripheral circuit region PERI2.

According to an embodiment, the plurality of sub row decoders S1 to S4 extending in the first direction X may be spaced apart from one another in the first peripheral circuit region PERI1 and the page buffer unit 112 extending in the second direction Y may be disposed in the second peripheral circuit region PERI2, and thus, an arrangement structure of peripheral circuits may be simplified. Therefore, a wiring length may be reduced and wiring complexity may decrease, and thus, a signal transfer speed may increase. Also, an arrangement space for peripheral circuits, except the row decoder 113 and the page buffer unit 112, may be secured and peripheral circuits (for example, a scheduler 115) may be further provided, and thus, the performance of the non-volatile memory device 110a may be increased.

Figure 6:
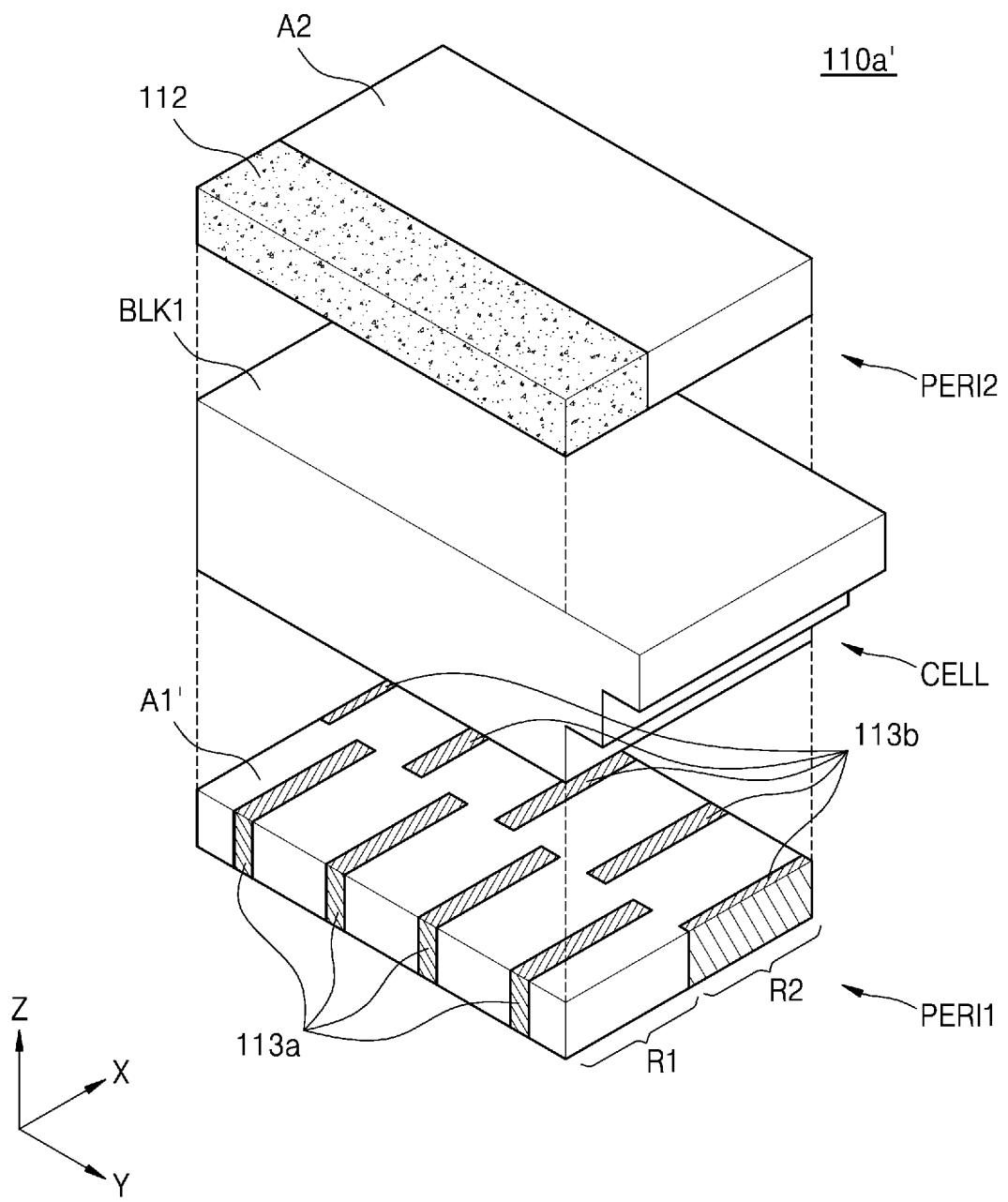
FIG. 6 is a diagram illustrating a non-volatile memory device implemented through wafer-to-wafer bonding, according to an embodiment.

FIG. 6 is a diagram illustrating a non-volatile memory device 110a' implemented with wafer-to-wafer bonding, according to an embodiment. In detail, FIG. 6 is a diagram describing an embodiment where the non-volatile memory device 110a of FIG. 4 is implemented through wafer-to-wafer bonding. Hereinafter, FIG. 3 will be described with reference to FIG. 2.

Referring to FIG. 6, a row decoder 113 disposed in a first peripheral circuit region PERI1 may include a plurality of first sub row decoders 113a arranged in a first row R1 and a plurality of second sub row decoders 113b arranged in a second row R2 adjacent to the first row R1 in a first direction X. The first sub row decoders 113a and the second sub row decoders 113b may extend in the first direction X and may be spaced apart from one another in the second direction Y. The first sub row decoders 113a and the second sub row decoders 113b may be arranged in a zigzag shape. Therefore, the first sub row decoders 113a might not overlap the second sub row decoders 113b.

The first sub row decoders 113a may be arranged at an equal interval in even numbers, and the second sub row decoders 113b may be arranged at an equal interval in odd numbers. For example, the first sub row decoders 113a may be arranged at an equal interval in fours with respect to each of a plurality of memory blocks, and the second sub row decoders 113b may be arranged at an equal interval in threes or fives with respect to each of a plurality of memory blocks. However, the inventive concept is not necessarily limited thereto, and the numbers of first and second sub row decoders 113a and 113b may be variously changed.

Peripheral circuits (for example, a voltage generator 116) operating based on a high voltage may be disposed in a region A1' between the first sub row decoders 113a and the second sub row decoders 113b. As the first sub row decoders 113a and the second sub row decoders 113b are arranged in a zigzag shape in the first row R1 and the second row R2, the peripheral circuits disposed in the region A1' between the first sub row decoders 113a and the second sub row decoders 113b may be connected to each other. Therefore, a wiring structure of peripheral circuits may be simplified, and a signal transfer speed may increase.

A page buffer unit 112 disposed in a second peripheral circuit region PERI2 may be disposed to extend in the second direction Y, and peripheral circuits operating based on a low voltage may be disposed in a region A2, except the page buffer unit 112, in the second peripheral circuit region PERI2.

Figure 7:
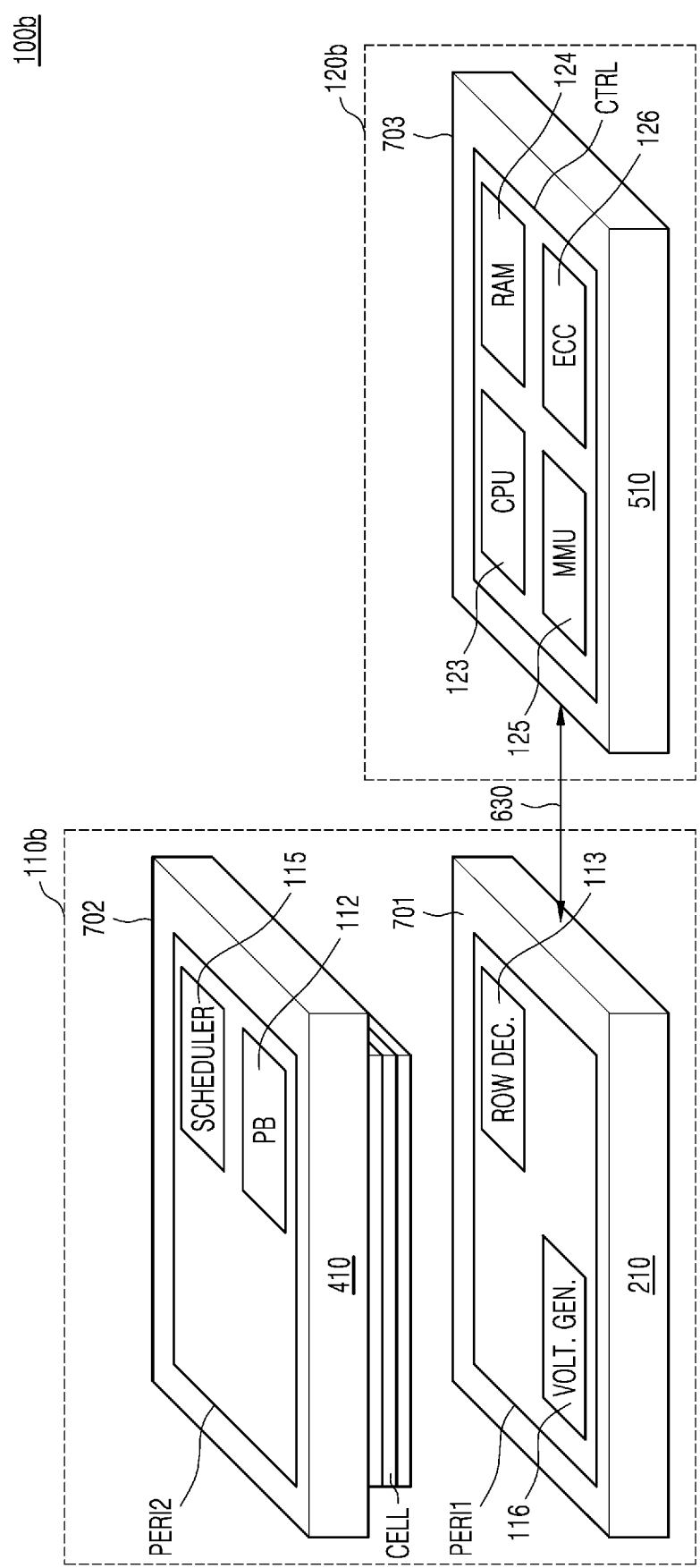
FIG. 7 is a diagram illustrating a storage device implemented through wafer-to-wafer bonding, according to an embodiment.

FIG. 7 is a diagram illustrating a storage device 100b implemented through wafer-to-wafer bonding, according to an embodiment. In detail, FIG. 7 is a diagram describing an embodiment where the storage device 100a of FIG. 4 is implemented through wafer-to-wafer bonding. Comparing with the storage device 100a of FIG. 4, the storage device 100b of FIG. 7 may have a difference in that the scheduler 115 disposed in the first peripheral circuit region PERI1 of the first chip 601 is disposed in a second peripheral circuit region PERI2 of a second substrate 410 of a second chip 702. Hereinafter, a difference with FIG. 4 will be mainly described with reference to FIGS. 1 to 4.

Referring to FIG. 7, a non-volatile memory device 110b may include a first chip 701 including a first peripheral circuit region PERI1 formed in a first substrate 210 and a second chip 702 including a cell region CELL and a second peripheral circuit region PERI2 formed in the second substrate 410. A voltage generator 116 and a row decoder 113 may be further provided in the first peripheral circuit region PERI1 of the first chip 701. A page buffer unit 112 and a scheduler 115 may be disposed in the second peripheral circuit region PERI2 of the second chip 702.

The scheduler 115 may set program operation conditions, read operation conditions, and/or erase operation conditions of the non-volatile memory device 110b to control an operation of the non-volatile memory device 110b. When operation conditions of the non-volatile memory device 110b are set or changed, the scheduler 115 may store the set or changed operation conditions of the non-volatile memory device 110b in the RAM 124 of the memory controller 120b. The scheduler 115 may be configured to share the RAM 124, and the operation conditions of the non-volatile memory device 110b may be set or changed by using the RAM 124.

Circuit elements of the scheduler 115 may be provided on a first surface of a second substrate 410, and the first surface of the second substrate 410 may denote a surface facing a first substrate 210. In FIG. 7, it is illustrated that only the scheduler 115 is disposed in the second peripheral circuit region PERI2, but the inventive concept is not necessarily limited thereto and at least a portion of the control logic circuit 114 may be disposed in the second peripheral circuit region PERI2.

According to an embodiment, the scheduler 115 included in the control logic circuit 114 may be disposed in the second peripheral circuit region PERI2, and peripheral circuits (for example, a voltage generator 116, the control logic circuit 114, the page buffer unit 112, the row decoder 113, etc.) may be divisionally provided in the first peripheral circuit region PERI1 and the second peripheral circuit region PERI2, whereby a space where peripheral circuits are provided may be secured. Therefore, the complexity of wirings may decrease, and the scheduler 115 may extend. Also, the reliability of the storage device 100b may be increased, and the device may be able to better operate at higher speeds.

Figure 8:
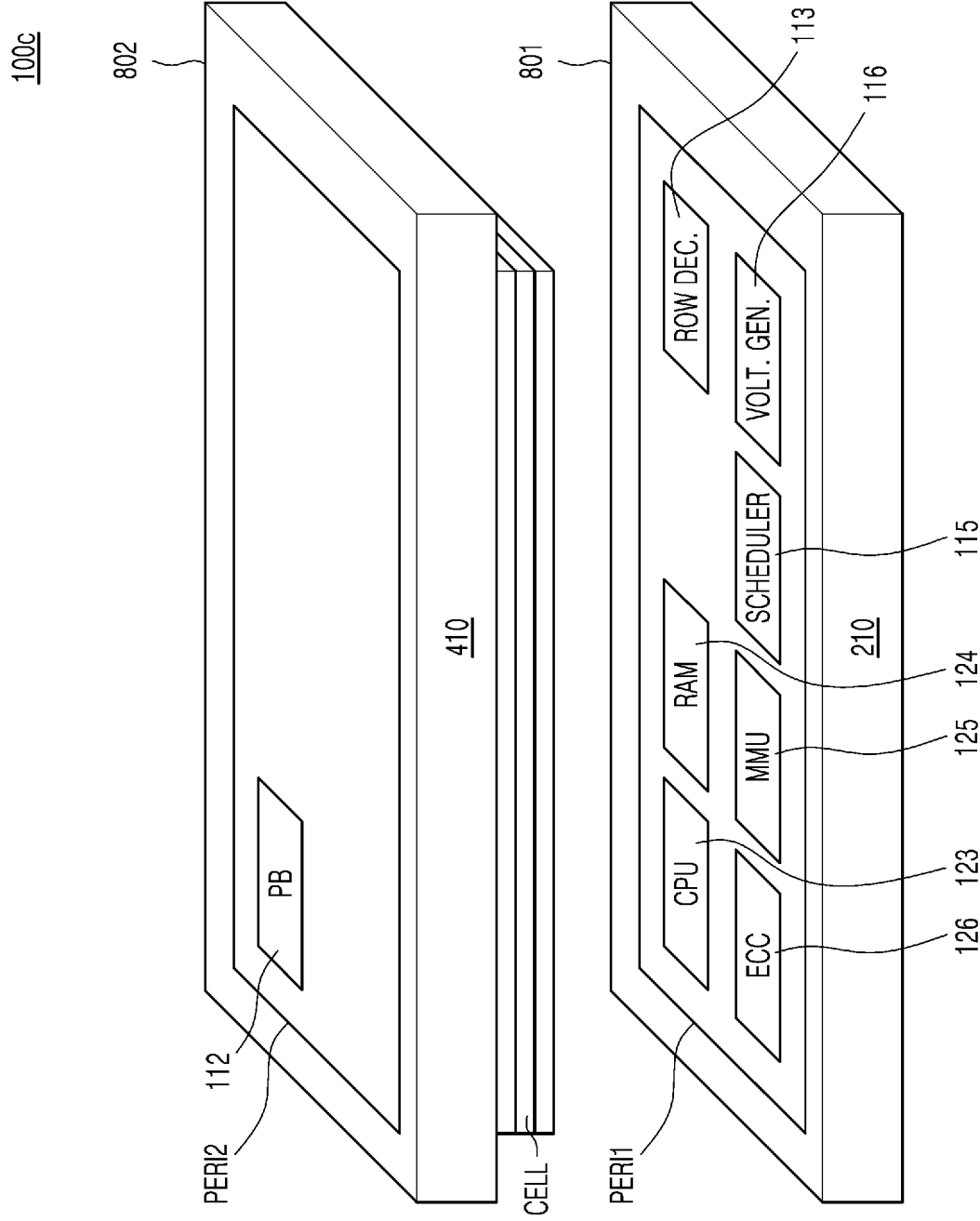
FIG. 8 is a diagram illustrating a storage device implemented through wafer-to-wafer bonding, according to an embodiment.

FIG. 8 is a diagram illustrating a storage device 100c implemented through wafer-to-wafer bonding, according to an embodiment. In detail, FIG. 8 is a diagram describing an embodiment where the storage device 100 of FIG. 1 is implemented through wafer-to-wafer bonding. Comparing with the storage device 100a of FIG. 4, the storage device 100c of FIG. 8 may have a difference in that a memory controller 120 and a row decoder 113 are disposed in a first peripheral circuit region PERI1 of a first chip 801. Hereinafter, a difference with FIG. 4 will be mainly described with reference to FIGS. 1 to 4.

Referring to FIG. 8, the storage device 110c may include a first chip 801 including a first peripheral circuit region PERI1 formed in a first substrate 210 and a second chip 802 including a cell region CELL and a second peripheral circuit region PERI2 formed in a second substrate 410. A voltage generator 116, a scheduler 115, a row decoder 113, and a CPU 123, an MMU 125, and an ECC processing unit 126 of a memory controller 120 may be provided in the first peripheral circuit region PERI1 of the first chip 801, and a page buffer unit 112 may be provided in the second peripheral circuit region PERI2 of the second chip 802.

In the storage device 100c, a conductive wire 630 described above with reference to FIG. 4 may be omitted. For example, the memory controller 120 of the storage device 100c may be directly connected to peripheral circuits (for example, the page buffer unit 112, the row decoder 113, the scheduler 115, the voltage generator 116, etc.) of a non-volatile memory device. Therefore, it might not be required that a memory interface (122 of FIG. 1) is separately disposed in the storage device 100c, and thus, the storage device 100c may be small. Moreover, the storage device 100c might not be affected by a signal line environment such as the interference distortion, reflection noise, and/or crosstalk of the conductive wire 630, and thus, the storage device 100c may be more able to operate at higher speeds.

According to an embodiment, the circuit elements 123 to 126 of the memory controller 120 may be embedded into the first chip 801 and relevant circuits may be arranged adjacent to each other, and thus, an external interface may be removed and adjacent circuits may be shared. Therefore, a size of the storage device 100c may be small, and performance may be increased.

According to an embodiment, in the first chip 801, the scheduler 115 may be disposed adjacent to the MMU 125. Therefore, a variety of codes associated with operation conditions of the non-volatile memory device stored in the MMU 125 may be quickly transferred to the scheduler 115 disposed adjacent to the MMU 125. The storage device 100c may be better able to perform at higher speeds by the scheduler 115 disposed adjacent to the MMU 125.

Figure 9:
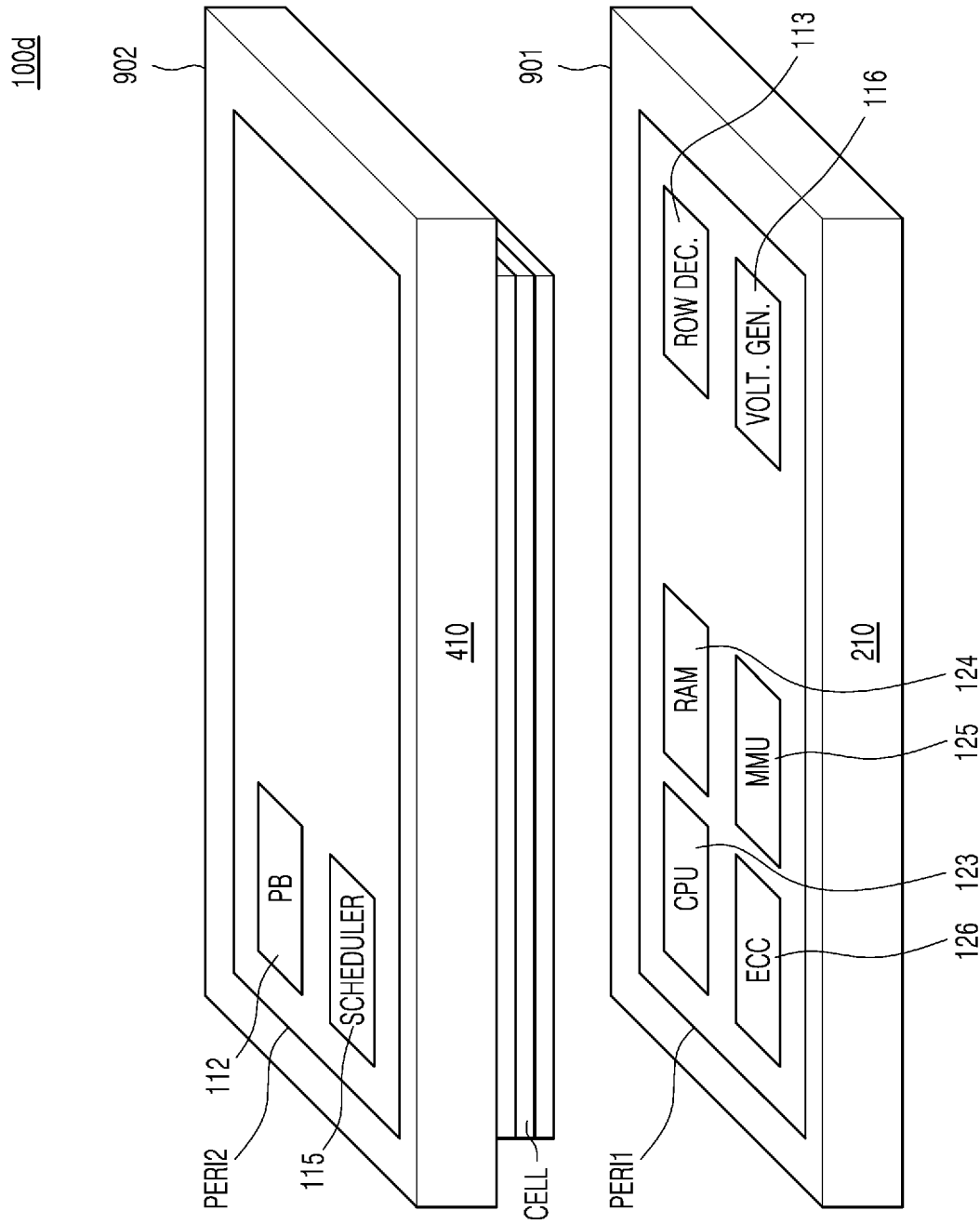
FIG. 9 is a diagram illustrating a storage device implemented through wafer-to-wafer bonding, according to an embodiment.

FIG. 9 is a diagram illustrating a storage device 100d implemented through wafer-to-wafer bonding, according to an embodiment. In detail, FIG. 9 is a diagram describing an embodiment where the storage device 100 of FIG. 1 is implemented through wafer-to-wafer bonding. Comparing with the storage device 100c of FIG. 8, the storage device 100d of FIG. 9 may have a difference in that the scheduler 115 disposed in the first peripheral circuit region PERI1 of the first chip 801 is disposed in a second peripheral circuit region PERI2 of a second substrate 410 of a second chip 902. Hereinafter, a difference with FIG. 8 will be mainly described with reference to FIGS. 1 to 8.

Referring to FIG. 9, the storage device 110d may include a first chip 901 including a first peripheral circuit region PERI1 formed in a first substrate 210 and a second chip 902 including a cell region CELL and a second peripheral circuit region PERI2 formed in a second substrate 410. A voltage generator 116, a row decoder 113, a CPU 123, RAM 124, an MMU 125, and an ECC processing unit 126 may be provided in the first peripheral circuit region PERI1 of the first chip 901, and a page buffer unit 112 and a scheduler 115 may be provided in the second peripheral circuit region PERI2 of the second chip 902. However, the inventive concept is not necessarily limited thereto, and as described above with reference to FIG. 7, at least a portion of a control logic circuit 114 including the scheduler 115 may be disposed in the second peripheral circuit region PERI2.

Figure 10:
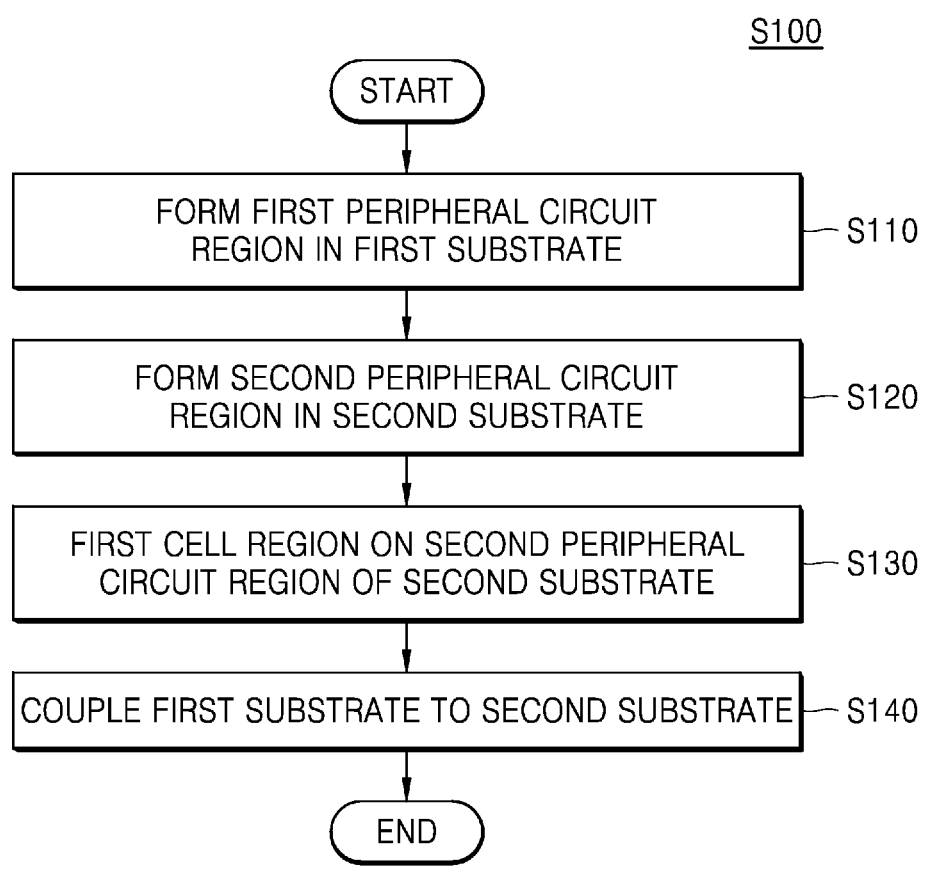
FIG. 10 is a flowchart describing a method of manufacturing a non-volatile memory device, according to an embodiment.

FIG. 10 is a flowchart describing a method of manufacturing a non-volatile memory device, according to an embodiment. In detail, FIG. 10 is a flowchart describing a method of manufacturing the non-volatile memory device 110 described above with reference to FIGS. 1 to 9. Hereinafter, FIG. 10 will be described with reference to FIGS. 1 to 9, and to the extent that one or more elements are not described in detail herein, it may be assumed that those elements are at least similar to corresponding elements that have been described elsewhere within the present disclosure.

Referring to FIG. 10, a method (S100) of manufacturing a non-volatile memory device may include operations S110 to S140.

In operation S110, a first peripheral circuit region PERI1 may be formed in a first substrate 210. The first peripheral circuit region PERI1 may include circuit devices configuring the row decoder 113 and circuit devices operating based on a high voltage. Operation S110 may include an operation of forming a plurality of sub row decoders (S1 to S4 of FIG. 5), which extend in a first direction X and are spaced apart from one another in a second direction Y, on the first substrate 210 and an operation of forming a row decoder 113, including first sub row decoders (113a of FIG. 5) which extend in the first direction X and are spaced apart from one another in a second direction Y in a first row (R1 of FIG. 6) and second sub row decoders (113b of FIG. 5) which are arranged in a second row (R2 of FIG. 6) in a zigzag shape with respect to the first sub row decoders (113a of FIG. 5), on the first substrate 210.

The circuit devices provided in the first peripheral circuit region PERI1 may include a first metal layer (230a, 230b, and 230c of FIG. 3) and a second metal layer (240a, 240b, and 240c of FIG. 3) which are sequentially stacked and may include a bonding metal (270a and 270b) formed on the second metal layer (240a and 240b of FIG. 3).

In operation S120, a second peripheral circuit region PERI2 may be formed in a second substrate 410. The second peripheral circuit region PERI2 may include circuit devices configuring the page buffer unit 112 and circuit devices operating based on a low voltage. Circuit devices, which are provided on the second substrate 410 and operate based on a low voltage, may include transistors for transferring data. Operation S120 may include an operation of forming the page buffer unit 112, extending in the second direction Y, on the second substrate 410. Operation S120 may further include an operation of forming a scheduler (115 of FIG. 2) in a region, except the page buffer unit 112 of the second substrate 410, and an operation of forming at least one of circuits of a memory controller (120 of FIG. 1) in a region, except the page buffer unit 112 of the second substrate 410.

The circuit devices provided in the second peripheral circuit region PERI2 may include a first metal layer (430a, 430b, and 430c of FIG. 3) and a second metal layer (440a, 440b, and 440c of FIG. 3) which are sequentially stacked.

In operation S130, a cell region CELL may be formed on the second peripheral circuit region PERI2. The cell region CELL may provide at least one memory block. The at least one memory block formed in the cell region CELL may include the common source line 320 and the plurality of word lines 331 to 338 (330) stacked on the common source line 320. Also, the at least one memory block formed in the cell region CELL may further include the channel structure CH which is formed to pass through the plurality of word lines 330. The channel structure CH may include a data storage layer, a channel layer, and a buried insulation layer, and the channel layer may be electrically connected to the bit line contact 350c and the bit line 360c. The bit line 360c may be electrically connected to the circuit device 420c formed in the second peripheral circuit region PERI2.

The plurality of word lines 330 may include pads having different lengths. The cell region CELL may include the first metal layer (330a and 330b of FIG. 3) and the second metal layer (340a and 340b of FIG. 3), which are electrically connected to the pads having different lengths and are sequentially stacked. Also, the cell region CELL may include the bonding metal (370a and 370b) formed on the second metal layer (340a and 340b of FIG. 3).

In operation S140, the first substrate 210 may be electrically connected to the second substrate 410 by using the wafer-to-wafer bonding scheme. For example, the bonding metal (270a and 270b) formed in the first peripheral circuit region PERI1 may be electrically connected to the bonding metal (370a and 370b) formed in the cell region CELL.

Therefore, the non-volatile memory device 110 having the C2C structure may be provided.

Figure 11:
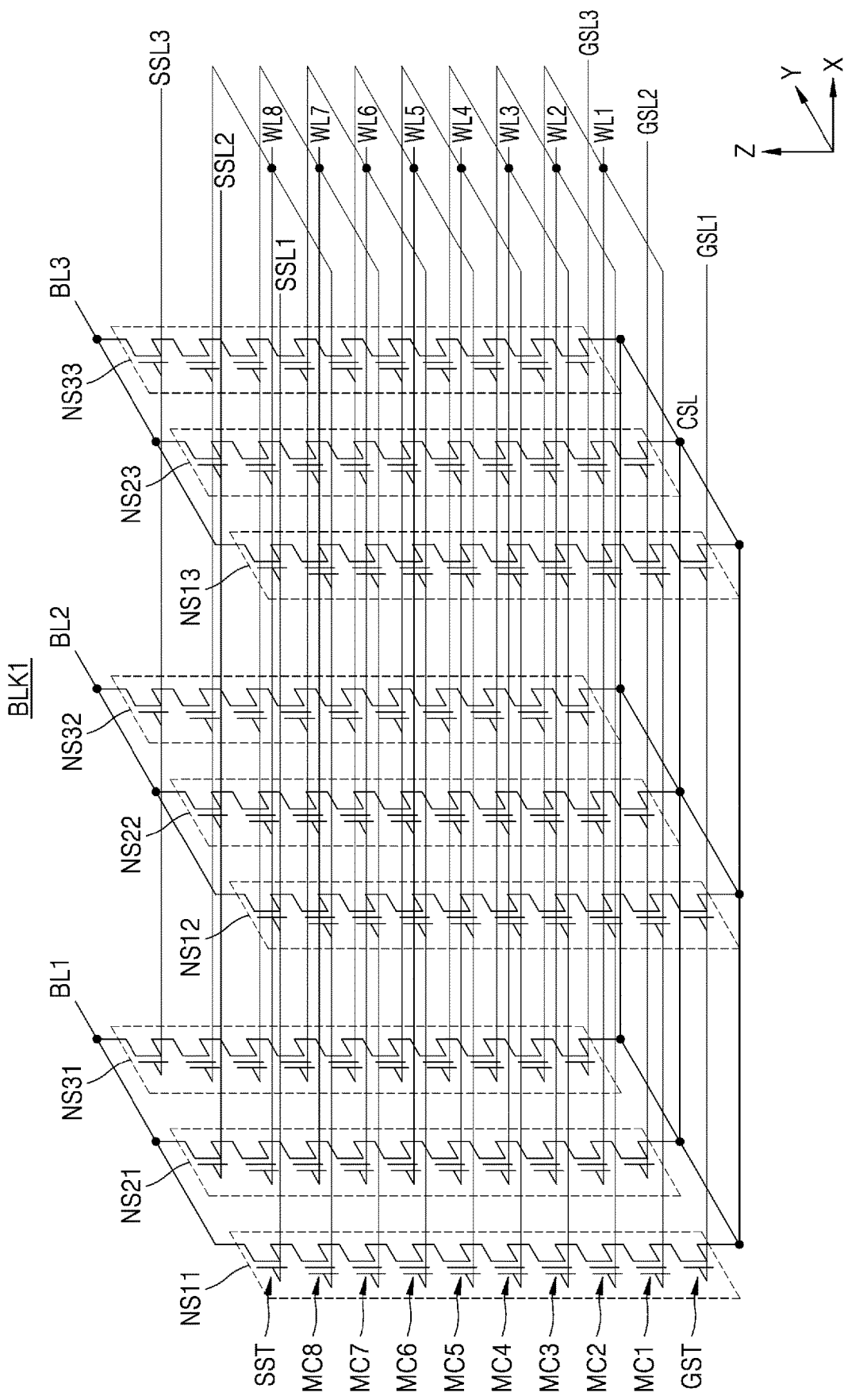
FIG. 11 is an equivalent circuit diagram of a memory block included in a non-volatile memory device according to an embodiment.

FIG. 11 is an equivalent circuit diagram of a memory block included in a non-volatile memory device according to an embodiment. The memory block illustrated in FIG. 11 may be one of the plurality of memory blocks BLK1 to BLKz described above with reference to FIG. 2, and for example, may be a first memory block BLK1. Hereinafter, the first memory block BLK1, according to embodiments, will be described for example. The first memory block BLK1 may be a 3D memory block formed in a 3D structure formed on a substrate. A plurality of memory cell strings included in the first memory block BLK1 may be formed a direction Z vertical to the substrate.

Referring to FIG. 11, the first memory block BLK1 may include NAND strings NS11 to NS33, word lines WL1 to WL8, bit lines BL1 to BL3, ground selection lines GSL1 to GSL3, string selection lines SSL1 to SSL3, and a common source line CSL. In FIG. 4, each of the NAND strings NS11 to NS33 is illustrated as including eight memory cells MC connected to eight word lines WL1 to WL8, but the inventive concept is not necessarily limited thereto.

Each NAND string (for example, NS11) may include a string selection transistor SST, a plurality of memory cells MC1 to MC8, and a ground selection transistor GST, which are serially connected to one another. The string selection transistor SST may be connected to a corresponding string selection line SSL1. Each of the plurality of memory cells MC may be connected to corresponding word lines WL1 to WL8. The ground selection transistor GST may be connected to a corresponding ground selection line GSL1. The string selection transistor SST may be connected to corresponding bit lines BL1 to BL3, and the ground selection transistor CST may be connected to the common source line CSL.

According to an embodiment, in each cell string, one or more dummy memory cells may be provided between the string selection transistor SST and the memory cells MC. In each cell string, one or more dummy memory cells may be provided between the ground selection transistor GST and the memory cells MC. In each cell string, one or more dummy memory cells may be provided between the memory cells MC. The dummy memory cells may have the same structure as the memory cells MC and might not be programmed (for example, program-prohibited) or may be programmed to be different from the memory cells MC. For example, in a case where the memory cells MC are programmed to have two or more threshold voltage distributions, the dummy memory cells may be programmed to have one threshold voltage distribution range or fewer threshold voltage distributions than the number of memory cells MC.

Figure 12:
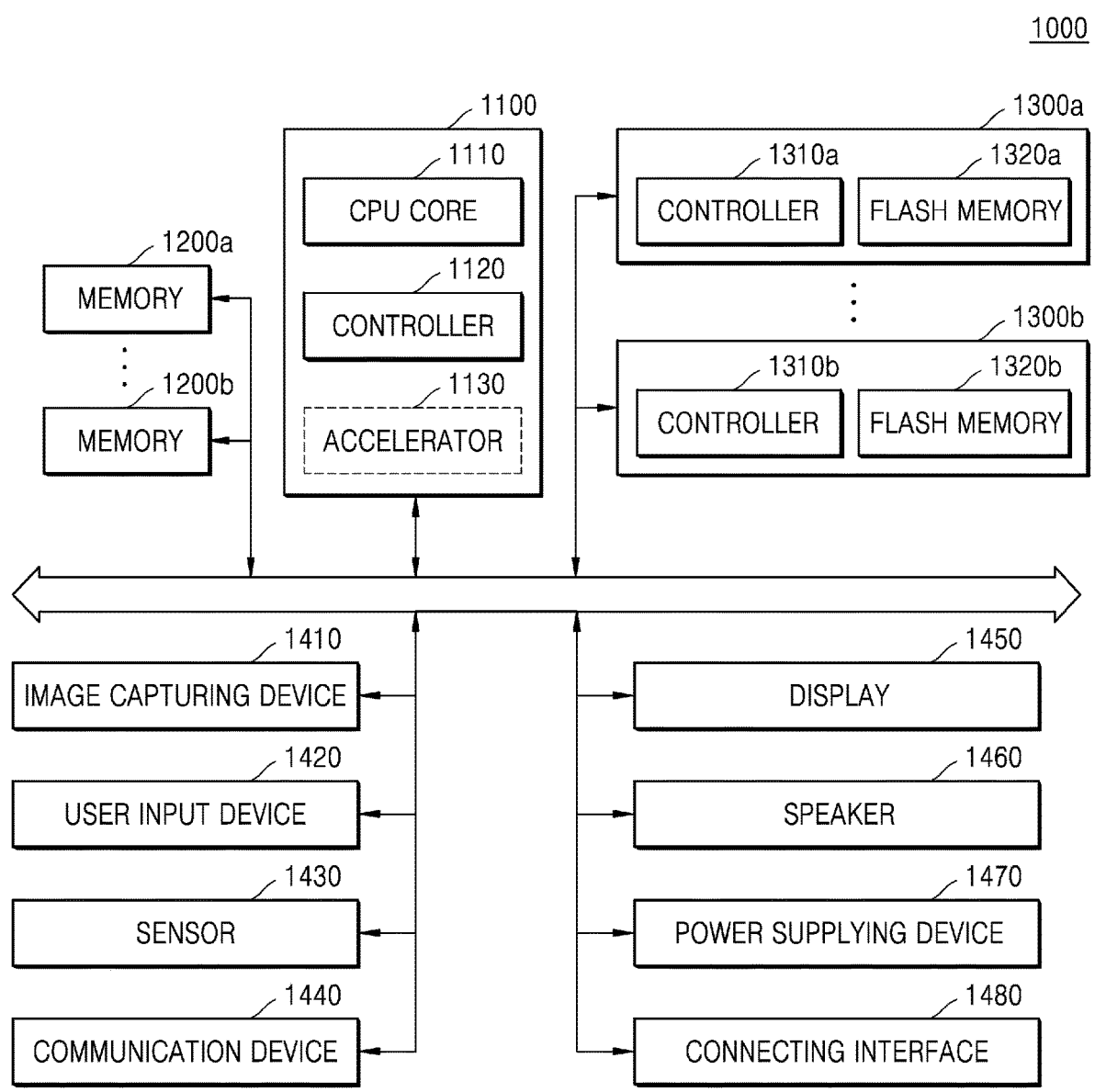
FIG. 12 is a diagram illustrating a system including a storage device, according to an embodiment.

FIG. 12 is a diagram illustrating a system 1000 including a storage device, according to an embodiment. The system 1000 of FIG. 12 may fundamentally include a mobile system such as a mobile phone, a smartphone, a tablet personal computer (PC), a wearable device, a healthcare device, or an Internet of things (IoT) device. However, the system 1000 of FIG. 12 is not necessarily limited to the mobile system and may include a PC, a laptop computer, a server, a media player, or an automotive device such as a navigation device.

Referring to FIG. 12, the system 1000 may include a main processor 1100, memories 1200a and 1200b, and storage devices 1300a and 1300b, and may further include an image capturing device 1410, a user input device 1420, a sensor 1430, a communication device 1440, a display 1450, a speaker 1460, a power supplying device 1470, and/or a connecting interface 1480.

The main processor 1100 may control an overall operation of the system 1000, and for example, may control operations of the other elements configuring the system 1000. The main processor 1100 may be implemented as a general-use processor, a dedicated processor, or an application processor.

The main processor 1100 may further include one or more CPU cores 1110 and a controller 1120 for controlling the memories 1200a and 1200b and/or the storage devices 1300a and 1300b. According to an embodiment, the main processor 1100 may further include an accelerator block 1130 which is a dedicated circuit for a high speed data operation such as an artificial intelligence (AI) data operation. The accelerator block 1130 may include a graphics processing unit (GPU), a neural processing unit (NPU), and/or a data processing unit (DPU) and may be implemented as a separate chip which is physically independent from the other elements of the main processor 1100.

The memories 1200a and 1200b may be used as a main memory device of the system 1000 and may include a volatile memory such as SRAM and/or DRAM, but is not necessarily limited thereto and may include a non-volatile memory such as PRAM and/or RRAM. The memories 1200a and 1200b may be implemented in the same package as the main processor 1100.

The storage devices 1300a and 1300b may function as a non-volatile storage device which stores data regardless of the supply or not of power and may have a storage capacity which is greater than that of the memories 1200a and 1200b. The storage devices 1300a and 1300b may include memory controllers 1310a and 1310b and non-volatile memory (NVM) devices 1320a and 1320b which store data according to the control of the memory controllers 1310a and 1310b. The non-volatile memory devices 1320a and 1320b may include V-NAND flash memory having a two-dimensional (2D) structure or a 3D structure, or may include a different kind of non-volatile memory such as PRAM and/or RRAM.

The storage devices 1300a and 1300b may be included in the system 1000 with being physically apart from the main processor 1100 or may be implemented in the same package as the main processor 1100. Also, the storage devices 1300a and 1300b may have a type such as a memory card, and thus, may be detachably coupled to the other elements of the system 1000 through an interface such as the connecting interface 1480 which will be described below. The storage devices 1300a and 1300b may be devices based on a protocol such as UFS but are not necessarily limited thereto.

The storage devices 1300a and 1300b may correspond to the storage device 100 described above with reference to FIGS. 1 to 9. In the storage devices 1300a and 1300b, a first chip where a first peripheral circuit region of each of the non-volatile memory devices 1320a and 1320b is formed in a first surface of a first substrate may be coupled to a second chip where 3D arrays of non-volatile memory cells and a second peripheral circuit region are formed in a first surface of a second substrate, according to the wafer-to-wafer bonding scheme. The first surface of the second substrate may denote a surface facing the first surface of the first substrate. A row decoder for selecting at least some of 3D arrays of memory cells in a row direction may be provided in the first chip, and a page buffer unit for selecting at least some of the 3D arrays of the memory cells in a column direction may be provided in the second chip.

The image capturing device 1410 may capture a still image or a moving image and may include a camera, a camcorder, and/or a webcam.

The user input device 1420 may receive data having various formats input from a user of the system 1000 and may include a touch pad, a keypad, a keyboard, a mouse, and/or a microphone.

The sensor 1430 may sense various types of physical amounts capable of being obtained from outside of the system 1000 and may convert the sensed physical amount into an electrical signal. The sensor 1430 may include a temperature sensor, a pressure sensor, an illumination sensor, a position sensor, an acceleration sensor, a biosensor, and/or a gyroscope.

The communication device 1440 may transmit and receive a signal to and from other devices outside the system 1000, according to various communication protocols. The communication device 440 may include an antenna, a transceiver, and/or a modem.

The display 1450 and the speaker 1460 may function as an output device which outputs each of visual information and acoustic information to the user of the system 1000.

The power supplying device 1470 may appropriately convert power supplied from a battery embedded into the system 1000 and/or an external power source and may supply the converted power to each element of the system 1000.

The connecting interface 1480 may provide a connection between the system 1000 and an external device which may be connected to the system 1000 and may transfer and receive data to and from the system 1000. The connecting interface 1480 may be implemented as various interface types such as, SATA, e-SATA, SCSI, SAS, PCI, PCIe, NVMe, IEEE 1394, USB, SD card, MMC, eMMC, UFS, eUFS, and CF card interfaces.

Figure 13:
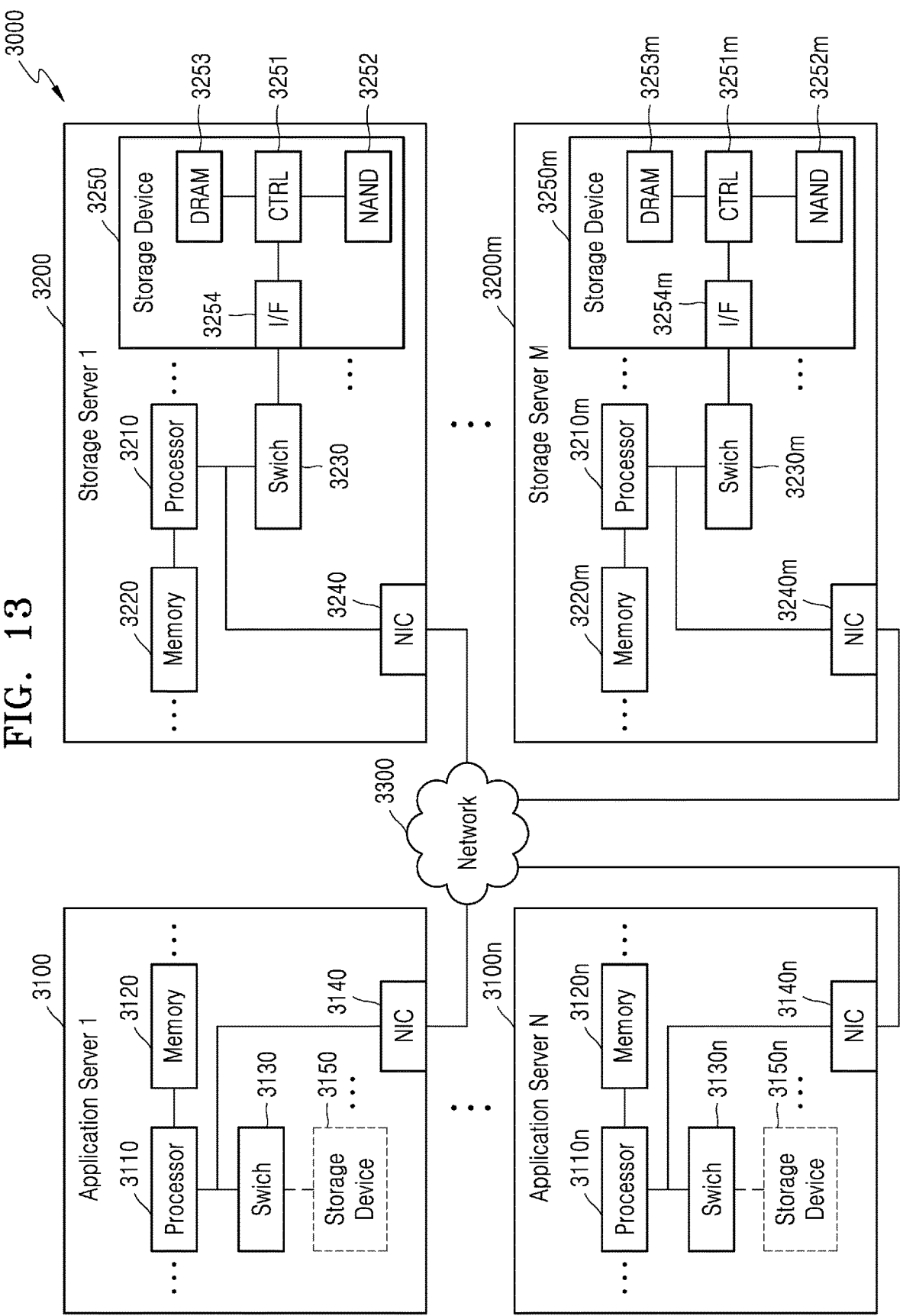
FIG. 13 is a diagram illustrating a data center including a storage device, according to an embodiment.

FIG. 13 is a diagram illustrating a data center 3000 including a storage device, according to an embodiment.

Referring to FIG. 13, the data center 3000 may be a facility which collects various pieces of data and provides a service and may be referred to as a data storage center. The data center 3000 may be a system for operating a search engine and a database and may be a computing system which is used in companies such as banks or government organizations. The data center 3000 may include a plurality of application servers 3100 to 3100$n$ and a plurality of storage servers 3200 to 3200$m$. The number of application servers 3100 to 3100$n$ and the number of storage servers 3200 to 3200$m$ may be variously determined, according to embodiments, and the number of application servers 3100 to 3100$n$ may differ from the number of storage servers 3200 to 3200$m$.

The application server 3100 or the storage server 3200 may include at least one of processors 3110 and 3210 and memories 3120 and 3220. To describe the storage server 3200 for example, the processor 3210 may control an overall operation of the storage server 3200 and may access the memory 3220 to execute an instruction and/or data loaded into the memory 3220. The memory 3220 may include double data rate synchronous DRAM (DDR SDRAM), high bandwidth memory (HBM), hybrid memory cube (HMC), dual in-line memory module (DIMM), Optane DIMM, or non-volatile DIMM (NVMDIMM). According to an embodiment, the number of processors 3210 and the number of memories 3220 each included in the storage server 3200 may be variously determined. In an embodiment, the processor 3210 and the memory 3220 may provide a processor-memory pair. In an embodiment, the number of processors 3210 may differ from the number of memories 3220. The processor 3210 may include a single-core processor or a multi-core processor. The description of the storage server 3200 may be similarly applied to the application server 3100. According to an embodiment, the application server 3100 might not include the storage device 3150. The storage server 3200 may include one or more storage devices 3250. The number of storage devices 3250 included in the storage server 3200 may be variously determined, according to embodiments.

The application servers 3100 to 3100$n$ and the storage servers 3200 to 3200$m$ may communicate with one another over a network 3300. The network 3300 may be implemented with a Fiber channel (FC) or Ethernet. In this case, the FC may be a medium used to transmit high-speed data and may use an optical switch which provides high performance/high availability. The storage servers 3200 to 3200$m$ may be provided as a file storage, a block storage, or an object storage according to an access scheme of the network 3300.

In an embodiment, the network 3300 may be a storage dedicated network such as a storage area network (SAN). For example, the SAN may be an FC-SAN which uses an FC network and is implemented based on FC protocol (FCP). For example, the SAN may be Internet protocol (IP)-SAN which uses transmission control protocol/Internet protocol (TCP/IP) and is implemented based on Internet SCSI (ISCSI) (or SCSI over TCP/IP) protocol. In an embodiment, the network 3300 may include a general network such as a TCP/IP network. For example, the network 3300 may be implemented based on a protocol such as FC over Ethernet (FCoE), network attached storage (NAS), or NVMe over Fabrics (NVMe-oF).

Hereinafter, the application server 3100 and the storage server 3200 will be mainly described. The description of the application server 3100 may be applied to the other application server 3100$n$, and the description of the storage server 3200 may be applied to the other storage server 3200$m$.

The application server 3100 may store data, storage-requested by a user or a client, in one of the storage servers 3200 to 3200$m$ over the network 3300. Also, the application server 3100 may obtain data, read-requested by the user or the client, from one of the storage servers 3200 to 3200$m$ over the network 3300. For example, the application server 3100 may be implemented as a web server or a database management system (DBMS).

The application server 3100 may access a memory 3120$n$ or a storage device 3150$n$ included in the application server 3100$n$ over the network 3300, or may access memories 3220 to 3220$m$ or storage devices 3250 to 3250$m$ included in the storage servers 3200 to 3200$m$ over the network 3300. Therefore, the application server 3100 may perform various operations on data stored in the application servers 3100 to 3100$n$ and/or the storage servers 3200 to 3200$m$. For example, the application server 3100 may execute an instruction for moving or copying data between the application servers 3100 to 3100$n$ and/or the storage servers 3200 to 3200$m$. In this case, the data may move from the storage devices 3250 to 3250$m$ of the storage servers 3200 to 3200$m$ to memories 3120 to 3120$n$ of the application servers 3100 to 3100$n$ directly or via memories 3220 to 3220$m$ of the storage servers 3200 to 3200$m$. Data moving over the network 3300 may be data which is encrypted for security or privacy.

To describe the storage server 3200 for example, the interface 3254 may provide a physical connection between the processor 3210 and the controller 3251 and a physical connection between an NIC 3240 and the controller 3251. For example, the interface 3254 may be implemented based on a direct attached storage (DAS) scheme which directly connects the storage device 3250 to a dedicate cable. Also, for example, the interface 3254 may be implemented as various interface types such as, SATA, e-SATA, SCSI, SAS, PCI, PCIe, NVMe, IEEE 1394, USB, SD card, MMC, eMMC. UFS, eUFS, and CF card interfaces.

The storage server 3200 may further include a switch 3230 and the NIC 3240. The switch 3230 may selectively connect the processor 3210 to the storage device 3250 according to the control of the processor 3210 or may selectively connect the NIC 3240 to the storage device 3250.

In an embodiment, the NIC 3240 may include a network interface card, a network adaptor, etc. The NIC 3240 may be connected to the network 3300 by a wired interface, a wireless interface, a Bluetooth interface, or an optical interface. The NIC 3240 may include an internal memory, a DSP, a host bus interface and may be connected to the processor 3210 and/or the switch 3230 through the host bus interface. The host bus interface may be implemented as one of the examples of the interface 3254 described above. In an embodiment, the NIC 3240 may be provided as one body with the processor 3210, the switch 3230, and/or the storage device 3250.

In the application servers 3100 to 3100n or the storage servers 3200 to 3200m, the processor 3210 may transmit a command to the storage devices 3150 to 3150n and 3250 to 3250m or the memories 3120 to 3120n and 3220 to 3220m to program or read data. In this case, the data may be data where an error has been corrected through an ECC engine. The data may be data obtained through data bus inversion (DBI) or data masking (DM) and may include cyclic redundancy code (CRC) information. The data may be data which is encrypted for security or privacy.

The storage devices 3150 to 3150n and 3250 to 3250m may transmit a control signal and a command/address signal to NAND flash memory devices 3252 to 3252m in response to a read command received from the processor 3210. Therefore, in a case where data is read from the NAND flash memory devices 3252 to 3252m, a read enable (RE) signal may be input as a data output control signal and may allow the data to be output to a DQ bus. A data strobe DQS may be generated by using the RE signal. A command and an address signal may be latched in a page buffer according to a rising edge or a falling edge of a write enable (WE) signal.

The controller 3251 may overall control an operation of the storage device 3250. In an embodiment, the controller 3251 may include SRAM. The controller 3251 may write data in the NAND flash memory device 3252 in response to a write command or may read data from the NAND flash memory device 3252 in response to a read command. For example, the write command and/or the read command may be provided from the processor 3210 of the storage server 3200, the processor 3210m of the storage server 3200m, or the processors 3110 and 3110m of the application servers 3100 and 3100m. The DRAM 3253 may temporarily store (buffer) data which is to be written in the NAND flash memory device 3252 or data which is to be read from the NAND flash memory device 3252. Also, the DRAM 3253 may store metadata. Here, the metadata may be user data or data which is generated by the controller 3251 so as to manage the NAND flash memory device 3252. The storage device 3250 may include a secure element (SE) for security or privacy.

The non-volatile memory device 3252 of the storage device, according to embodiments, may correspond to the non-volatile memory device 100 described above with reference to FIGS. 1 to 9. In the non-volatile memory device 3252, a first chip where a first peripheral circuit region including a row decoder is formed in a first surface of a first substrate may be coupled to a second chip where a second peripheral circuit region including 3D arrays of non-volatile memory cells and a page buffer unit is formed in a first surface of a second substrate, according to the wafer-to-wafer bonding scheme. The first surface of the second substrate may denote a surface facing the first surface of the first substrate.

Hereinabove, exemplary embodiments have been described in the drawings and the specification. Therefore, it may be understood by those of ordinary skill in the art that various modifications and other equivalent embodiments may be implemented from the inventive concept.

While the inventive concept has been particularly shown and described with reference to embodiments thereof, it will be understood that various changes in form and details may be made therein without departing from the spirit and scope of the present disclosure.

What is claimed is:

1. A storage device including a non-volatile memory device, the non-volatile memory device comprising:
   a first substrate including a first peripheral circuit region, the first peripheral region including a row decoder configured to select one word line from among a plurality of word lines of a three-dimensional (3D) memory cell array; and
   a second substrate including a second peripheral circuit region, the second peripheral circuit region including a page buffer unit configured to select at least one bit line from among a plurality of bit lines of the 3D memory cell array, and a cell region including the 3D memory cell array formed in the second peripheral circuit region,
   wherein the 3D memory cell array is disposed between the first peripheral circuit region and the second peripheral circuit region by vertically stacking and bonding the second substrate on and to the first substrate.

2. The storage device of claim 1, wherein the page buffer unit extends in a second direction that is normal to a first direction.

3. The storage device of claim 2, wherein the row decoder comprises a plurality of sub row decoders spaced apart from one another in the second direction to extend in the first direction.

4. The storage device of claim 3, wherein
   the 3D memory cell array comprises a plurality of memory blocks, and
   each of the plurality of sub row decoders is arranged at an equal interval, in groups of four, with respect to each of the plurality of memory blocks.

5. The storage device of claim 2, wherein
   the row decoder comprises:
   a plurality of first sub row decoders, spaced apart from one another in the second direction in a first row of the first peripheral circuit region to extend in the first direction; and
   a plurality of second sub row decoders, spaced apart from one another in the second direction in a second row adjacent to the first row in the first direction to extend in the first direction,
   wherein the plurality of first sub row decoders and the plurality of second sub row decoders are each arranged in a zigzag shape.

6. The storage device of claim 5, wherein
   the 3D memory cell array comprises a plurality of memory blocks, the plurality of first sub row decoders are arranged at an equal interval, in groups of four, with respect to each of the plurality of memory blocks, and the plurality of second sub row decoders are arranged at an equal interval, in groups of three, with respect to each of the plurality of memory blocks.

7. The storage device of claim 5, wherein the 3D memory cell array comprises a plurality of memory blocks, the plurality of first sub row decoders are arranged at an equal interval, in groups of four, with respect to each of the plurality of memory blocks, and the plurality of second sub row decoders are arranged at an equal interval, in groups of five, with respect to each of the plurality of memory blocks.

8. The storage device of claim 1, wherein circuit devices operating on a low voltage are arranged in a region of the second peripheral circuit region.

9. The storage device of claim 8, wherein the second peripheral circuit region further comprises a scheduler configured to control at least one of a voltage level, an application timing, and an application time of each of corresponding control signals according to an operation mode of the non-volatile memory device.

10. The storage device of claim 1, wherein circuit devices operating on a high voltage are arranged in a region of the first peripheral circuit region.

11. The storage device of claim 10, wherein the first peripheral circuit region further comprises a voltage generator configured to generate voltages needed for performing operations of the non-volatile memory device.

12. The storage device of claim 1, wherein the second peripheral circuit region further comprises at least one circuit of a memory controller configured to control the non-volatile memory device.

13. A non-volatile memory device including a three-dimensional (3D) memory cell array including a plurality of memory blocks, the non-volatile memory device comprising:

a first substrate including a first peripheral circuit region including a row decoder, the row decoder configured to select one word line from among a plurality of word lines of the 3D memory cell array, and circuit devices operating based on a high voltage; and a second substrate including a second peripheral circuit region, including a page buffer unit, the page buffer unit configured to select at least one bit line from among a plurality of bit lines of the 3D memory cell array, and a cell region including the 3D memory cell array formed in the second peripheral circuit region, wherein the cell region is disposed between the first peripheral circuit region and the second peripheral circuit region by vertically stacking and bonding the second substrate on and to the first substrate, and the page buffer unit extends in a second direction that is normal to a first direction.

14. The non-volatile memory device of claim 13, wherein the row decoder comprises a plurality of second sub row decoders spaced apart from one another in the second direction and extending in the first direction.

15. The non-volatile memory device of claim 14, wherein the plurality of second sub row decoders are arranged at an equal interval, in groups of five, with respect to each of the plurality of memory blocks.

16. The non-volatile memory device of claim 13, wherein the row decoder comprises:

a plurality of first sub row decoders spaced apart from one another in the second direction in a first row of the first peripheral circuit region and extending in the first direction; and a plurality of second sub row decoders spaced apart from one another in the second direction in a second row adjacent to the first row in the first direction and extending in the first direction, wherein the plurality of first sub row decoders and the plurality of second sub row decoders are each arranged in a zigzag shape.

17. The non-volatile memory device of claim 16, wherein the plurality of first sub row decoders are arranged at an equal interval, in even numbered groups, with respect to each of the plurality of memory blocks, and the plurality of second sub row decoders are arranged at an equal interval, in odd numbered groups, with respect to each of the plurality of memory blocks.

18. The non-volatile memory device of claim 13, wherein the second peripheral circuit region further comprises a scheduler configured to control a voltage level, an application timing, and/or an application time of each of corresponding control signals according to an operation mode of the non-volatile memory device.

19. The non-volatile memory device of claim 13, wherein the first peripheral circuit region further comprises a voltage generator configured to generate voltages needed for performing operations of the non-volatile memory device.

20. A method of manufacturing a storage device including a three-dimensional (3D) memory cell array, the method comprising:

forming a first peripheral circuit region, including a row decoder, the row decoder configured to select one word line from among a plurality of word lines of the 3D memory cell array, and circuit devices operating on a high voltage, in a first substrate;

forming a second peripheral circuit region, including a page buffer unit, the page buffer unit configured to select at least one bit line from among a plurality of bit lines of the 3D memory cell array, and circuit devices operating on a low voltage, in a second substrate which differs from the first substrate;

forming a cell region, including the 3D memory cell array, on the second peripheral circuit region in the second substrate; and vertically stacking the second substrate on the first substrate and bonding the second substrate to the first substrate so that the cell region is provided between the first peripheral circuit region and the second peripheral circuit region.

\* \* \* \* \*